(12) United States Patent
Kita

(10) Patent No.: US 7,728,657 B2
(45) Date of Patent: Jun. 1, 2010

(54) PLL CIRCUIT, PHASE SHIFTING METHOD, AND IC CHIP

(75) Inventor: Masato Kita, Kanagawa (JP)

(73) Assignee: Sony Corporation, Tokyo (JP)

( * ) Notice: Subject to any disclaimer, the term of this patent is extended or adjusted under 35 U.S.C. 154(b) by 348 days.

(21) Appl. No.: 11/980,389

(22) Filed: Oct. 31, 2007

(65) Prior Publication Data

US 2008/0157868 A1    Jul. 3, 2008

(30) Foreign Application Priority Data

Nov. 2, 2006    (JP) .............................. 2006-298815

(51) Int. Cl.
*H04L 27/22* (2006.01)
(52) U.S. Cl. .................... 329/307; 329/304; 329/306; 329/308; 332/103; 455/110; 375/223; 375/302; 375/322
(58) Field of Classification Search ................ 332/103; 455/110; 375/223, 302, 322
See application file for complete search history.

(56) References Cited

U.S. PATENT DOCUMENTS

| 4,061,977 | A | * | 12/1977 | Motley et al. ................ 375/371 |
| 4,859,959 | A | * | 8/1989 | Sharpe ......................... 329/306 |
| 6,310,513 | B1 | * | 10/2001 | Iemura ......................... 329/304 |
| 6,411,658 | B1 | * | 6/2002 | Sasaki .......................... 375/326 |
| 2007/0104291 | A1 | * | 5/2007 | Yoon ............................ 375/324 |

FOREIGN PATENT DOCUMENTS

| EP | 0 708 534 A2 | 4/1996 |
| EP | 0 757 464 A2 | 2/1997 |
| EP | 1 696 624 A1 | 8/2006 |
| JP | 04280538 A | 10/1992 |
| JP | 05-300183 | 11/1993 |
| JP | 11-274919 | 10/1999 |
| JP | 11-274919 A | 10/1999 |
| WO | WO-2005/079032 A1 | 8/2005 |

OTHER PUBLICATIONS

Japanese Office Action issued Aug. 12, 2008 for corresponding Japanese Application No. 2006-298815.
Singapore Examination Report; Application No. 200717131-7; Dated Jul. 3, 2008.

* cited by examiner

*Primary Examiner*—Arnold Kinkead
*Assistant Examiner*—Richard Tan
(74) *Attorney, Agent, or Firm*—Rader, Fishman & Grauer PLLC

(57) ABSTRACT

A Phased Locked Loop (PLL) circuit includes: a clock signal generating unit for generating a first clock signal and a second clock signal of which the phase differs from the first clock signal by $\Pi/2$; a computing unit for computing first phase comparison results showing the results of comparing the phases of a signal wherein the first clock signal is subjected to phase shifting with the PSK modulation signal and second phase comparison results showing the results of comparing the phases of a signal wherein the second clock signal is subjected to phase shifting with the PSK modulation signal based on first and second parameters, the first clock signal, the second clock signal, and the PSK modulation signal; a control direction setting unit for virtually controlling the control angle; a parameter control unit; and a reading control unit for controlling the timing of reading data from the PSK modulation.

11 Claims, 28 Drawing Sheets

| | | SIGN OF ΣV11 | | |
|---|---|---|---|---|
| | | + | − | 0 |
| SIGN OF ΣV12 | + | + | − | − |
| | − | − | + | − |
| | 0 | 0 | 0 | 0 |

FIG. 9

| Φn | cos_para | sin_para |
|---|---|---|
| 0 | 8 | 0 |
| 1 | 7 | 1 |
| 2 | 6 | 2 |
| 3 | 5 | 3 |
| 4 | 4 | 4 |
| 5 | 3 | 5 |
| 6 | 2 | 6 |
| 7 | 1 | 7 |
| 8 | 0 | 8 |
| 9 | −1 | 7 |
| 10 | −2 | 6 |
| 11 | −3 | 5 |
| 12 | −4 | 4 |
| 13 | −5 | 3 |
| 14 | −6 | 2 |
| 15 | −7 | 1 |
| 16 | −8 | 0 |
| 17 | −7 | −1 |
| 18 | −6 | −2 |
| 19 | −5 | −3 |
| 20 | −4 | −4 |
| 21 | −3 | −5 |
| 22 | −2 | −6 |
| 23 | −1 | −7 |
| 24 | 0 | −8 |
| 25 | 1 | −7 |
| 26 | 2 | −6 |
| 27 | 3 | −5 |
| 28 | 4 | −4 |
| 29 | 5 | −3 |
| 30 | 6 | −2 |
| 31 | 7 | −1 |

FIG. 10

| Φn | CLOCK COUNTER FOR READING DATA |
|---|---|
| 1 TO 4 | 0 |
| 5 TO 8 | 1 |
| 9 TO 12 | 2 |
| 13 TO 16 | 3 |
| 17 TO 20 | 4 |
| 21 TO 24 | 5 |
| 25 TO 28 | 6 |
| 29 TO 31, 0 | 7 |

PATTERN 1

PATTERN 2

PATTERN 3

PATTERN 4

PATTERN 5

PATTERN 6

PATTERN 7

PATTERN 8

| Φn | CLOCK COUNTER FOR READING DATA |
|---|---|
| 17 TO 20 | 0 |
| 21 TO 24 | 1 |
| 25 TO 28 | 2 |
| 29 TO 31, 0 | 3 |
| 1 TO 4 | 4 |
| 5 TO 8 | 5 |
| 9 TO 12 | 6 |
| 13 TO 16 | 7 |

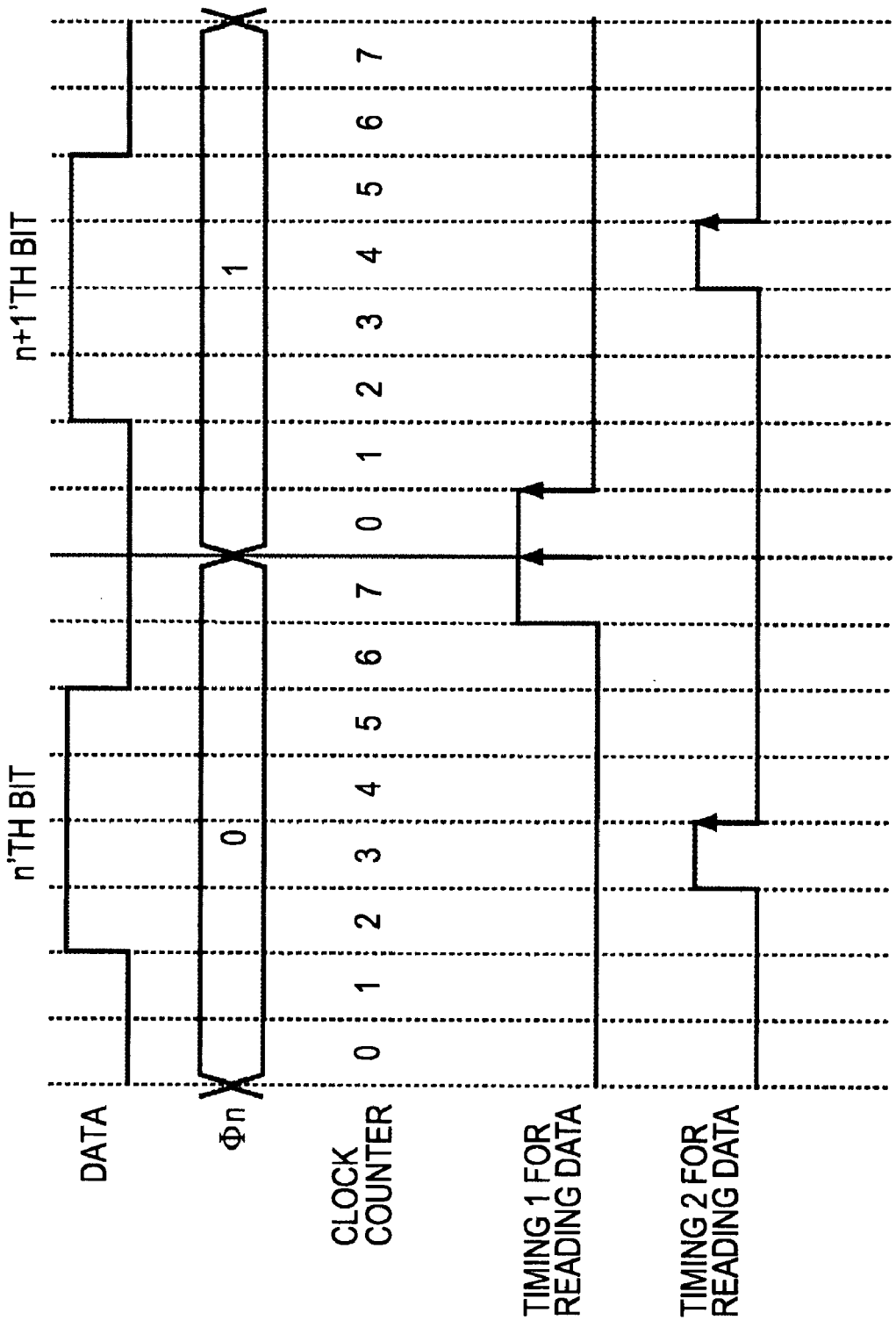

PLL CIRCUIT, PHASE SHIFTING METHOD, AND IC CHIP

CROSS REFERENCES TO RELATED APPLICATIONS

The present invention contains subject matter related to Japanese Patent Application JP 2006-298815 filed in the Japanese Patent Office on Nov. 2, 2006, the entire contents of which are incorporated herein by reference.

BACKGROUND OF THE INVENTION

1. Field of the Invention

The present invention relates to a Phased Locked Loop (PLL) circuit, phase shifting method, and Integrated Circuit (IC) chip, and particularly relates to a PLL circuit, phase shifting method, and IC chip configured to improve reception precision without increasing clock frequency.

2. Description of the Related Art

Heretofore, for non-contact IC card communication, a digital Phased Locked Loop (PLL) such as a Costas-Loop has been used in order to extract a sampling clock from a digital signal subjected to Phase Shift Keying (PSK) modulation with Manchester encoding (for example, see Japanese Unexamined Patent Application Publication No. 11-274919)

FIG. 1 is a circuit diagram illustrating an example of a traditional digital PLL. The digital PLL 1 in FIG. 1 is configured with a Costas-Loop, and is made up of a frequency dividing oscillating circuit 11, phase shift circuit 12, Exor circuits 13a and 13b, and Low Pass Filter (LPF) 14a and 14b.

With the frequency dividing oscillating circuit 11, the clock frequency input from an unshown oscillating circuit divides a 13.56 MHz clock signal f_clk eight ways, thereby generating a signal sin(wt+Φ) serving as a 1696 kHz clock signal and supplying this to the phase shift circuit 12 and Exor circuit 13a.

The phase shift circuit 12 generates a signal cos(wt+Φ) wherein the phase of the signal sin(wt+Φ) is delayed by Π/2 (90 degrees), and supplies this to the Exor circuit 13b.

The Exor circuit 13a computes an exclusive OR from the 1696 kbps (kilobit per second) signal DATA serving as a digital signal subjected to Phase Shift Keying (PSK) modulation with Manchester encoding and the signal sin(wt+Φ), generates a signal V1 indicating a value V1 wherein the computed results are inverted (=DATA·sin(wt+Φ)), and supplies this to the LPF 14a.

The Exor circuit 13b computes an exclusive OR from the signal DATA and the signal cos(wt+Φ), generates a signal V2 indicating a value V2 wherein the computed results are inverted (=DATA cos(wt+Φ)), and supplies this to the LPF 14b.

For every 8 clocks of the clock signal f_clk, the LPF 14a adds the value V1 across the period of the 8 clocks, generates a signal ΣV1 indicating an added value ΣV1 (=Σ{DATA sin(wt+Φ)), and supplies this to the frequency dividing oscillating circuit 11.

For every 8 clocks of the clock signal f_clk, the LPF 14b adds the value V2 across the period of the 8 clocks, generates a signal ΣV2 indicating an added value ΣV2 (=Σ{DATA·cos (wt+Φ)), and supplies this to the frequency dividing oscillating circuit 11.

The frequency dividing oscillating circuit 11 controls a control angle Φ based on the values ΣV1 and ΣV2 such that the value ΣV2 becomes zero, and causes the phases of the signal DATA and the signal sin(wt+φ) to be synchronized, thereby demodulating the phase of the signal DATA and extracting a sampling clock from the signal DATA.

SUMMARY OF THE INVENTION

Now, with a traditional digital PLL, the phase thereof is controlled in increments of single clocks of the input clock signal; therefore, the phase resolution depends on the ratio of clock frequency and input signal frequency. For example, with the digital PLL 1 in FIG. 1, the clock frequency is 13.56 MHz whereas the frequency of the signal DATA serving as the input signal is 1696 kHz, so the resolution becomes 2Π/8 (=2Π×1696 kHz/13.56 MHz).

Accordingly, in order to improve receiving precision of data or to improve the phase resolution of the digital PLL to correspond to a higher transfer rate, the clock frequency needs to be higher.

However, when the clock frequency is higher, power expenditure also is increased greatly, e.g. with a non-contact IC card driven by electrical power supplied from an external reader/writer, communication quality can deteriorate from lack of power.

It has been found desirable to improve receiving precision without increasing clock frequency.

A Phase Locked Loop (PLL) circuit according to an embodiment of the present invention includes: a clock signal generating unit configured to generate a first clock signal with a frequency as with that of a Phase Shift Keying (PSK) modulation signal serving as a digital signal subjected to PSK modulation, and a second clock signal of which the phase differs from the first clock signal by Π/2; a computing unit configured to compute, for each time period of a predetermined length, first phase comparison results showing the results of comparing the phases of a signal wherein the first clock signal is subjected to phase shifting of an amount equivalent to a control angle which is an angle to virtually control the phases of the first clock signal and the second clock signal with the PSK modulation signal during the time period, and second phase comparison results showing the results of comparing the phases of a signal wherein the second clock signal is subjected to phase shifting of an amount equivalent to the control angle with the PSK modulation signal during the time period, based on a first parameter corresponding to the cosine of the control angle, a second parameter corresponding to the sine of the control angle, the first clock signal, the second clock signal, and the PSK modulation signal; a control direction setting unit configured to set the control direction for virtually controlling the control angle based on the first phase comparison results and the second phase comparison results; a parameter control unit configured to control the first parameter and the second parameter based on the control angle virtually controlled in the control direction; and a reading control unit configured to control the timing of reading data from the PSK modulation signal based on the control angle virtually controlled in the control direction.

The computing unit may be configured to compute the first phase comparison results and the second phase comparison results for each cycle of the PSK modulation signal.

The computing unit may be configured to compute the first phase comparison results and the second phase comparison results for every ½ cycle of the PSK modulation signal with the control direction setting unit finding the control direction for every ½ cycle of the PSK modulation signal, and determining the control direction for every cycle of the PSK modulation signal based on the two control directions obtained.

The computing unit may be configured to compute a value wherein the sum of a first multiplied value having multiplied the first parameter, the PSK modulation signal, and the first clock signal, and a second multiplied value having multiplied the second parameter, the PSK modulation signal, and the second clock signal is cumulatively added over the time period as the first phase comparison results, and computes a value wherein the sum of a third multiplied value having inverted the sign of the value wherein the second parameter, the PSK modulation signal, and the first clock signal are multiplied, and a fourth multiplied value having multiplied the first parameter, the PSK modulation signal, and the second clock signal is cumulatively added over the time period as the second phase comparison results.

The computing unit may further include a multiplying unit configured to compute the first through the fourth multiplied values; a first cumulative adding unit configured to cumulatively add the first multiplied value every other time, over the time period; a second cumulative adding unit configured to cumulatively add the first multiplied value every other time, so as to alternate with the first adding unit, over the time period; a third cumulative adding unit configured to cumulatively add the second multiplied value every other time, over the time period; a fourth cumulative adding unit configured to cumulatively add the second multiplied value every other time, so as to alternate with the third adding unit, over the time period; a fifth cumulative adding unit configured to cumulatively add the third multiplied value every other time, over the time period; a sixth cumulative adding unit configured to cumulatively add the third multiplied value every other time, so as to alternate with the fifth adding unit, over the time period; a seventh cumulative adding unit configured to cumulatively add the fourth multiplied value every other time, over the time period; an eighth cumulative adding unit configured to cumulatively add the fourth multiplied value every other time, so as to alternate with the seventh adding unit, over the time period; a first adding unit configured to compute the sum of the first cumulatively added value computed with the first cumulative adding unit and the second cumulatively added value computed with the third cumulative adding unit or the sum of the first cumulatively added value computed with the second cumulative adding unit and the second cumulatively added value computed with the fourth cumulative adding unit; and a second adding unit configured to compute the sum of the third cumulatively added value computed with the fifth cumulative adding unit and the fourth cumulatively added value computed with the seventh cumulative adding unit or the sum of the third cumulatively added value computed with the sixth cumulative adding unit and the fourth cumulatively added value computed with the eighth cumulative adding unit.

The reading control unit may be configured to control the timing for reading data from the PSK modulation signal so as to read data twice at a timing wherein the phase differs by just Π for a cycle of the PSK modulation signal.

A phase control method according to an embodiment of the present invention includes the steps of: generating a first clock signal with a frequency approximately equal to that of a PSK modulation signal serving as a digital signal subjected to PSK modulation, and a second clock signal of which the phase differs from the first clock signal by Π/2; computing, for each time period of a predetermined length, first phase comparison results showing the results of comparing the phases of a signal wherein the first clock signal is subjected to phase shifting of an amount equivalent to a control angle which is an angle to virtually control the phases of the first clock signal and the second clock signal with the PSK modulation signal during the time period, and second phase comparison results showing the results of comparing the phases of a signal wherein the second clock signal is subjected to phase shifting of an amount equivalent to the control angle with the PSK modulation signal during the time period, based on a first parameter corresponding to the cosine of the control angle and a second parameter corresponding to the sine of the control angle, the first clock signal, the second clock signal, and the PSK modulation signal; setting the control direction for virtually controlling the control angle based on the first phase comparison results and the second phase comparison results; controlling the first parameter and the second parameter based on the control angle virtually controlled in the control direction; and controlling the timing of reading data from the PSK modulation signal based on the control angle virtually controlled in the control direction.

With this arrangement, a first clock signal with a frequency approximately equal to that of a PSK modulation signal serving as a digital signal subjected to PSK modulation and a second clock signal of which the phase differs from the first clock signal by Π/2 are generated; first phase comparison results showing the results of comparing the phases of a signal wherein the first clock signal is subjected to phase shifting of an amount equivalent to a control angle which is an angle to virtually control the phases of the first clock signal and the second clock signal with the PSK modulation signal during the time period, and second phase comparison results showing the results of comparing the phases of a signal, wherein the second clock signal is subjected to phase shifting of an amount equivalent to the control angle with the PSK modulation signal during the time period, are computed for each time period of a predetermined length based on a first parameter corresponding to the cosine of the control angle, a second parameter corresponding to the sine of the control angle, the first clock signal, the second clock signal, and the PSK modulation signal; the control direction for virtually controlling the control angle is set based on the first phase comparison results and the second phase comparison results; the first parameter and the second parameter are controlled based on the control angle virtually controlled in the control direction; and the timing of reading data from the PSK modulation signal is controlled based on the control angle virtually controlled in the control direction.

According to an embodiment of the present invention, an Integrated Circuit (IC) chip with the functionality to demodulate a PSK modulation signal serving as a digital signal subjected to PSK modulation, having a PLL circuit, includes: a clock signal generating unit configured to generate a first clock signal with a frequency as with that of the PSK modulation signal and a second clock signal of which the phase differs from the first clock signal by Π/2; a computing unit configured to compute, for each time period of a predetermined length, first phase comparison results showing the results of comparing the phases of a signal wherein the first clock signal is subjected to phase shifting of an amount equivalent to a control angle which is an angle to virtually control the phases of the first clock signal and the second clock signal with the PSK modulation signal during the time period and second phase comparison results showing the results of comparing the phases of a signal wherein the second clock signal is subjected to phase shifting of an amount equivalent to the control angle with the PSK modulation signal during the time period based on a first parameter corresponding to the cosine of the control angle, a second parameter corresponding to the sine of the control angle, the first clock signal, the second clock signal, and the PSK modulation signal; a control direction setting unit configured to set the control direction for virtually controlling the control angle based on the first phase comparison results and the second phase comparison results; a parameter control unit configured to control the first parameter and the second parameter based on the control angle virtually controlled in the control direction; and a reading control unit configured to control the timing of reading data from the PSK modulation signal based on the control angle virtually controlled in the control direction.

The IC chip may be configured to have non-contact IC card functionality, read/write functionality, or read functionality.

With this arrangement, an IC chip with the functionality to demodulate a PSK modulation signal serving as a digital signal subjected to PSK modulation, the first clock signal with a frequency approximately equal to that of the PSK modulation signal and the second clock signal of which the phase differs from the first clock signal by Π/2 are generated; first phase comparison results showing the results of comparing the phases of a signal wherein the first clock signal is subjected to phase shifting of an amount equivalent to a control angle which is an angle to virtually control the phases of the first clock signal and the second clock signal with the PSK modulation signal during the time period and second phase comparison results showing the results of comparing the phases of a signal wherein the second clock signal is subjected to phase shifting of an amount equivalent to the control angle with the PSK modulation signal during the time period, are computed for each time period of a predetermined length based on a first parameter corresponding to the cosine of the control angle, a second parameter corresponding to the sine of the control angle, the first clock signal, the second clock signal, and the PSK modulation signal; the control direction for virtually controlling the control angle is set based on the first phase comparison results and the second phase comparison results; the first parameter and the second parameter are controlled based on the control angle virtually controlled in the control direction; and the timing of reading data from the PSK modulation signal is controlled based on the control angle virtually controlled in the control direction.

According to these arrangements, the timing is controlled for reading the data, and in particular, receiving precision can be improved without increasing the clock frequency.

BRIEF DESCRIPTION OF THE DRAWINGS

FIG. 9 is a chart illustrating an example of the values of cos_para and sin_para;

FIG. 10 is a diagram for describing an example of timing for reading data;

FIG. 31 is a diagram describing the operation of the digital PLL in FIG. 28.

DESCRIPTION OF THE PREFERRED EMBODIMENTS

Before describing embodiments of the present invention, the correspondence between the features of the claims and the specific elements disclosed in embodiments of the present invention is discussed below. This description is intended to assure that embodiments supporting the claimed invention are described in this specification. Thus, even if an element in the following embodiments is not described as relating to a certain feature of the present invention, that does not necessarily mean that the element does not relate to that feature of the claims. Conversely, even if an element is described herein as relating to a certain feature of the claims, it does not necessarily mean the element does not relate to the other features of the claims.

Figure 5:
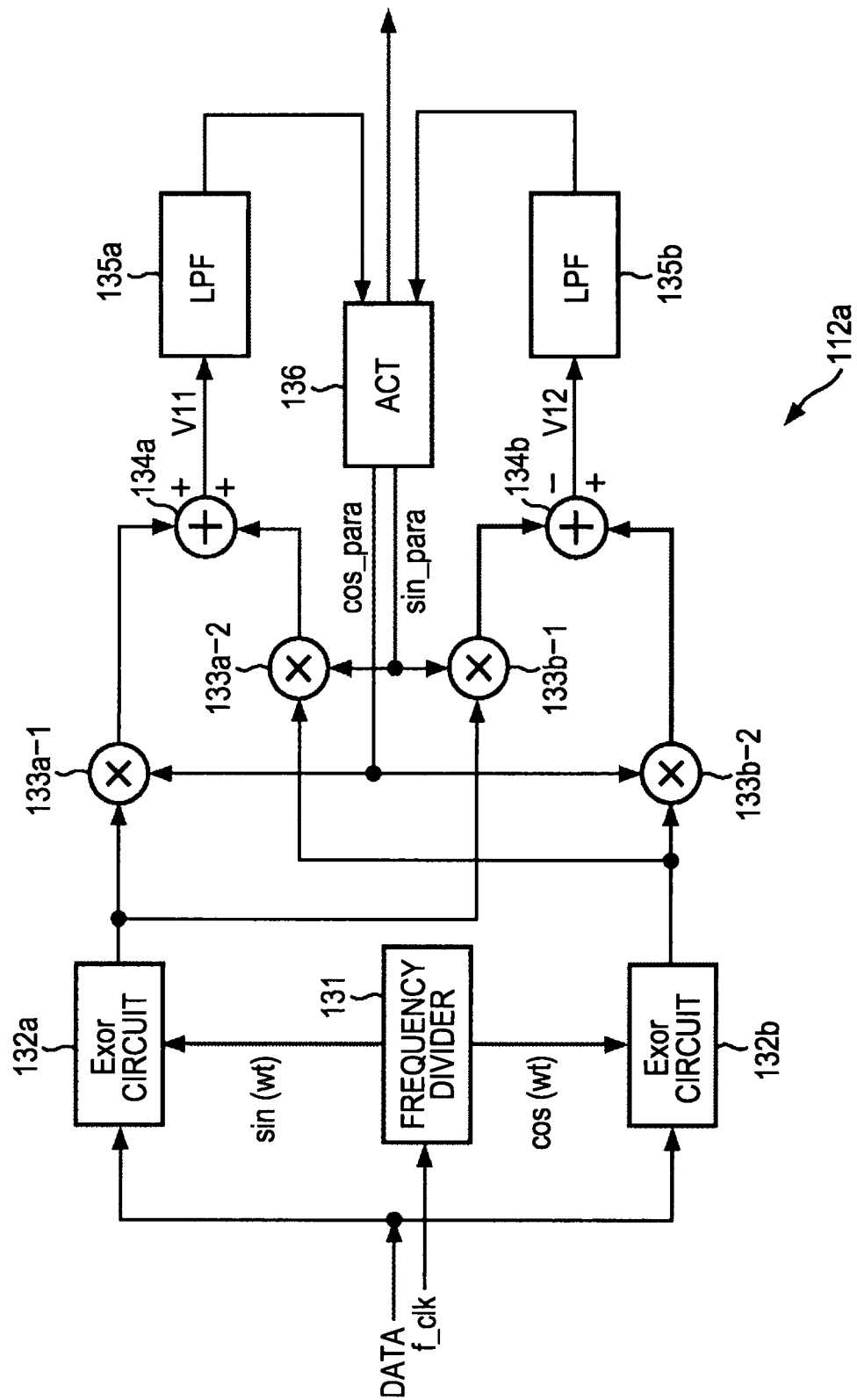
FIG. 5 is a circuit diagram illustrating a first embodiment of the digital PLL in FIG. 2.
Figure 6:
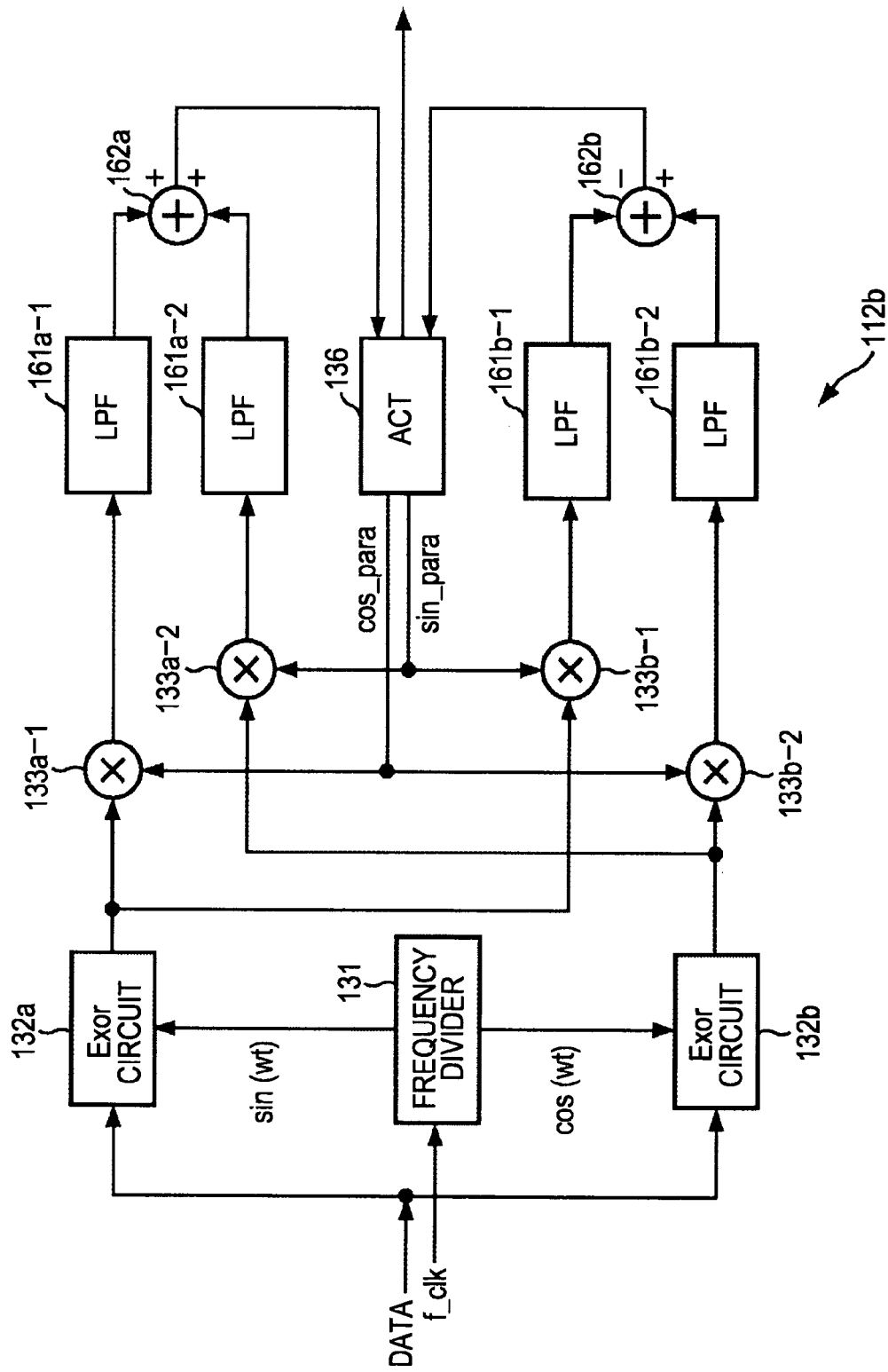
FIG. 6 is a circuit diagram illustrating a second embodiment of the digital PLL in FIG. 2.
Figure 25:
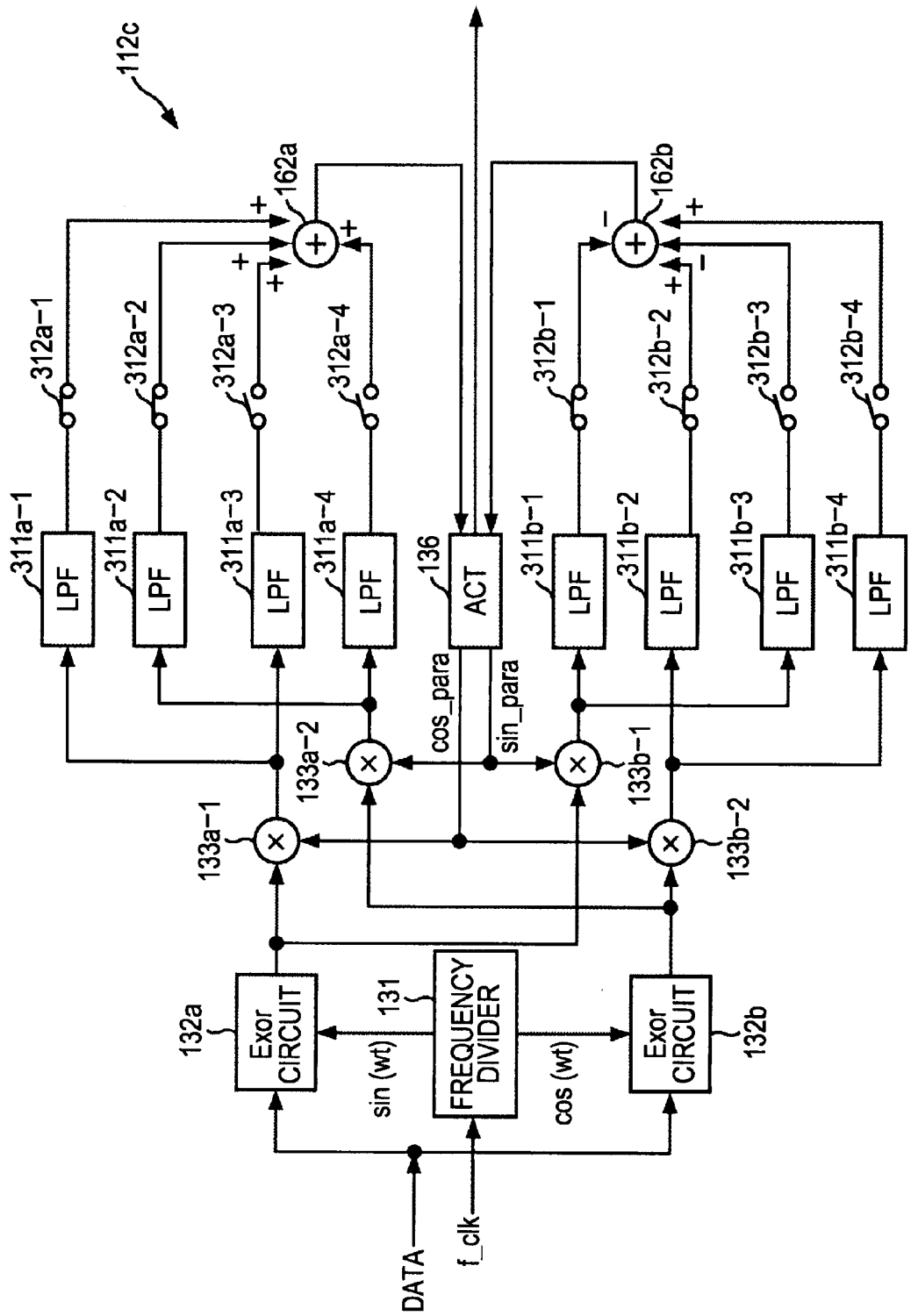
FIG. 25 is a circuit diagram illustrating a third embodiment of the digital PLL in FIG. 2.
Figure 28:
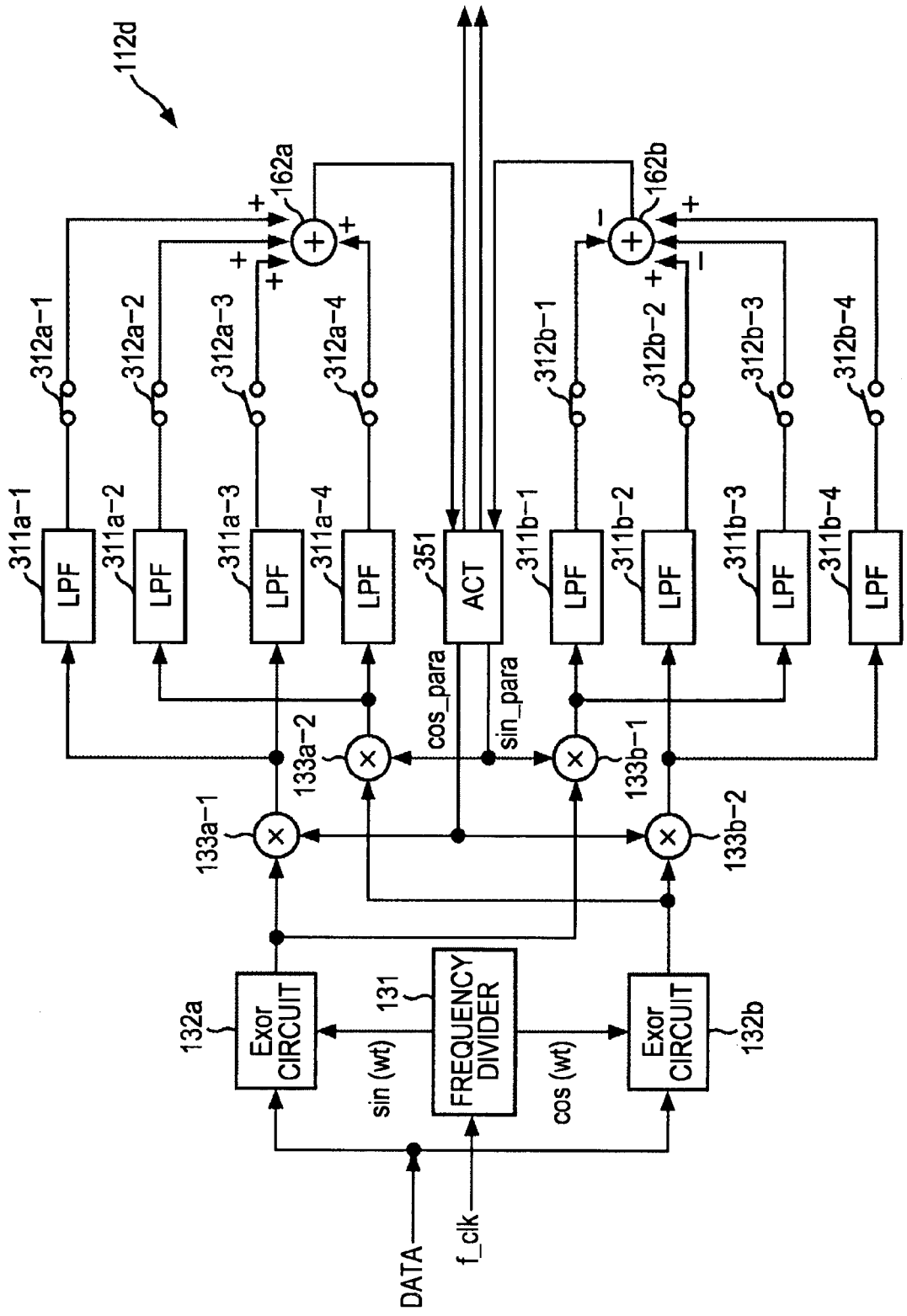
FIG. 28 is a circuit diagram illustrating a fourth embodiment of the digital PLL in FIG. 2.

A Phased Locked Loop (PLL) circuit (e.g., a digital PLL 112a in FIG. 5, a digital PLL 112b in FIG. 6, a digital PLL 112c in FIG. 25, or a digital PLL 112d in FIG. 28) according to an embodiment of the present invention may include, firstly, a clock signal generating unit (e.g., a frequency divider 131 in FIG. 5, 6, 25, or 28) configured to generate a first clock signal (e.g., signal sin(wt)) with a frequency approximately equal to that of a Phase Shift Keying (PSK) modulation signal serving as a digital signal subjected to PSK modulation, and a second clock signal (e.g., signal cos(wt)) of which the phase differs from the first clock signal by Π/2; a computing unit (e.g., Exor circuits 132a and 132b, multipliers 133a-1 through 133b-2, adders 134a and 134b, and LPF 135a and 135b in FIG. 5, Exor circuits 132a and 132b, multipliers 133a-1 through 133b-2, LPF 161a-1 through 161b-2, and adders 162a and 162b in FIG. 6, Exor circuits 132a and 132b, multipliers 133a-1 through 133b-2, LPF 311a-1 through 311b-4, and adders 162a and 162b in FIG. 25; or Exor circuits 132a and 132b, multipliers 133a-1 through 133b-2, LPF 311a-1 through 311b-4, and adders 162a and 162b in FIG. 28) configured to compute, for each time period of a predetermined length, first phase comparison results (e.g., value ΣV11) showing the results of comparing the phases of a signal wherein the first clock signal is subjected to phase shifting of an amount equal to a control angle which is an angle to virtually control the phases of the first clock signal and the second clock signal with the PSK modulation signal during the time period, and second phase comparison results (e.g., value ΣV12) showing the results of comparing the phases of a signal wherein the second clock signal is subjected to phase shifting of an amount equal to the control angle with the PSK modulation signal during the time period, based-on a first parameter (e.g., cos_para) corresponding to the cosine of the control angle, a second parameter (e.g., sin_para) corresponding to the sine of the control angle, the first clock signal, the second clock signal, and the PSK modulation signal; a control direction setting unit (e.g., a control direction detecting unit 181 in FIG. 7 or FIG. 29) configured to set the control direction for virtually controlling the control angle based on the first phase comparison results and the second phase comparison results; a parameter control unit (e.g., a parameter control unit 183 in FIG. 7 or FIG. 29) configured to control the first parameter and the second parameter based on the control angle virtually controlled in the control direction; and a reading control unit (e.g., a reading timing control unit 184 in FIG. 7 or a reading timing control unit 371 in FIG. 29) configured to control the timing of reading data from the PSK modulation signal based on the control angle virtually controlled in the control direction.

The PLL circuit according to an embodiment of the present invention may include, secondly, the computing unit; the multiplying unit (e.g., Exor circuits 132a and 132b, and multipliers 133a-1 through 133b-2 in FIG. 25 or 28) configured to compute the first through the fourth multiplied values; a first cumulative adding unit (e.g., Low Pass Filter (LPF) 311a-1 in FIG. 25 or 28) configured to cumulatively add the first multiplied value every other time, over the time period; a second cumulative adding unit (e.g., LPF 311a-3 in FIG. 25 or 28) configured to cumulatively add the first multiplied value every other time, so as to alternate with the first cumulative adding unit, over the time period; a third cumulative adding unit (e.g., LPF 311a-2 in FIG. 25 or 28) configured to cumulatively add the second multiplied value every other time, over the time period; a fourth cumulative adding unit (e.g., LPF 311a-4 in FIG. 25 or 28) configured to cumulatively add the second multiplied value every other time, so as to alternate with the third cumulative adding unit, over the time period; a fifth cumulative adding unit (e.g., LPF 311b-1 in FIG. 25 or 28) configured to cumulatively add the third multiplied value every other time, over the time period; a sixth cumulative adding unit (e.g., LPF 311b-3 in FIG. 25 or 28) configured to cumulatively add the third multiplied value every other time, so as to alternate with the fifth cumulative adding unit, over the time period; a seventh cumulative adding unit (e.g., LPF 311b-2 in FIG. 25 or 28) configured to cumulatively add the fourth multiplied value every other time, over the time period; an eighth cumulative adding unit (e.g., LPF 311b-4 in FIG. 25 or 28) configured to cumulatively add the fourth multiplied value every other time, so as to alternate with the seventh cumulative adding unit, over the time period; a first adding unit (e.g., adder 162a in FIG. 25 or 28) configured to compute the sum of the first cumulatively added value computed with the first cumulative adding unit and the second cumulatively added value computed with the third cumulative adding unit or the sum of the first cumulatively added value computed with the second cumulative adding unit and the second cumulatively added value computed with the fourth cumulative adding unit; and a second adding unit (e.g., adder 162b in FIG. 25 or 28) configured to compute the sum of the third cumulatively added value computed with the fifth cumulative adding unit and the fourth cumulatively added value computed with the seventh cumulative adding unit or the sum of the third cumulatively added value computed with the sixth cumulative adding unit and the fourth cumulatively added value computed with the eighth cumulative adding unit.

A phase control method according to an embodiment of the present invention includes steps of generating a first clock signal (e.g., signal sin(wt)) with a frequency approximately equal to that of a PSK modulation signal (e.g., signal DATA) serving as a digital signal subjected to PSK modulation, and a second clock signal (e.g., signal cos(wt)) of which the phase differs from the first clock signal by Π/2; computing, for each time period of a predetermined length, first phase comparison results (e.g., value ΣV11) showing the results of comparing the phases of a signal wherein the first clock signal is subjected to phase shifting of an amount equal to a control angle which is an angle to virtually control the phases of the first clock signal and the second clock signal with the PSK modulation signal during the time period, and second phase comparison results (e.g., value ΣV12) showing the results of comparing the phases of a signal wherein the second clock signal is subjected to phase shifting of an amount equal to the control angle with the PSK modulation signal during the time period, based on a first parameter (e.g., cos_para) corresponding to the cosine of the control angle, a second parameter (e.g., sin_para) corresponding to the sine of the control angle, the first clock signal, the second clock signal, and the PSK modulation signal; setting the control direction for virtually controlling the control angle based on the first phase comparison results and the second phase comparison results; controlling the first parameter and the second parameter based on the control angle virtually controlled in the control direction; and controlling the timing of reading data from the PSK modulation signal based on the control angle virtually controlled in the control direction.

An Integrated Circuit (IC) chip (e.g., a non-contact IC chip 101 in FIG. 2) according to an embodiment of the present invention, with the functionality to demodulate a PSK modulation signal (e.g., signal DATA) serving as a digital signal subjected to PSK modulation, having a PLL circuit (e.g., the digital PLL 112a in FIG. 5, digital PLL 112b in FIG. 6, digital PLL 112c in FIG. 25, or digital PLL 112d in FIG. 28), includes a clock signal generating unit (the frequency divider 131 in FIG. 5, 6, 25, or 28) configured to generate a first clock signal (e.g., signal sin(wt)) with a frequency approximately equal to that of the PSK modulation signal and a second clock signal (e.g., signal cos(wt)) of which the phase differs from the first clock signal by Π/2; a computing unit (e.g., (e.g., Exor circuits 132a and 132b, multipliers 133a-1 through 133b-2, adders 134a and 134b, and LPF 135a and 135b in FIG. 5, Exor circuits 132a and 132b, multipliers 133a-1 through 133b-2, LPF 161a-1 through 161b-2, and adders 162a and 162b in FIG. 6, Exor circuits 132a and 132b, multipliers 133a-1 through 133b-2, LPF 311a-1 through 311b-4, and adders 162a and 162b in FIG. 25, or Exor circuits 132a and 132b, multipliers 133a-1 through 133b-2, LPF 311a-1 through 311b-4, and adders 162a and 162b in FIG. 28) configured to compute for each time period of a predetermined length, first phase comparison results (e.g., value ΣV11) showing the results of comparing the phases of a signal wherein the first clock signal is subjected to phase shifting of an amount equal to a control angle which is an angle to virtually control the phases of the first clock signal and the second clock signal with the PSK modulation signal during the time period, and second phase comparison results (e.g., value ΣV12) showing the results of comparing the phases of a signal wherein the second clock signal is subjected to phase shifting of an amount equal to the control angle with the PSK modulation signal during the time period, based on a first parameter (e.g., cos_para) corresponding to the cosine of the control angle, a second parameter (e.g., sin_para) corresponding to the sine of the control angle, the first clock signal, the second clock signal, and the PSK modulation signal; a control direction setting unit (e.g., the control direction detecting unit 181 in FIG. 7 or 29) configured to set the control direction for virtually controlling the control angle based on the first phase comparison results and the second phase comparison results; a parameter control unit (e.g., the parameter control unit 183 in FIG. 7 or 29) configured to control the first parameter and the second parameter based on the control angle virtually controlled in the control direction; and a reading control unit (e.g., the reading timing control unit 184 in FIG. 7 or the reading timing control unit 371 in FIG. 29) configured to control the timing of reading data from the PSK modulation signal based on the control angle virtually controlled in the control direction.

Embodiments of the present invention will now be described below with reference to the diagrams.

Figure 2:
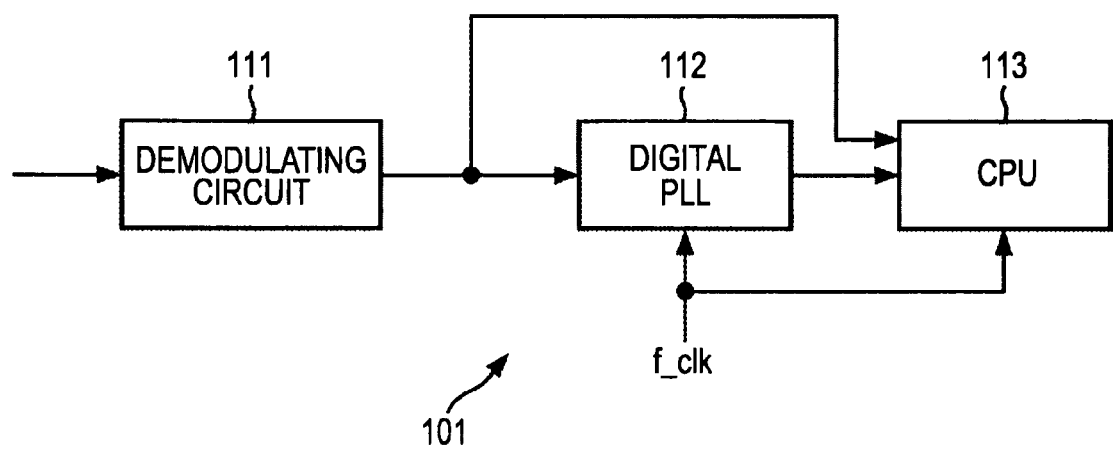
FIG. 2 is a block diagram illustrating an embodiment of a non-contact IC chip wherein the present embodiment is applied.

FIG. 2 is a block diagram illustrating a portion of an embodiment of a non-contact IC (Integrated Circuit) to which the present invention has been applied. The non-contact IC chip 101 in FIG. 2 is an IC chip having non-contact IC card functionality, and for example, has a function to restore original data from a digital signal subjected to PSK modulation, i.e. a function for demodulating a digital signal subjected to PSK modulation. The non-contact IC chip 101 is arranged so as to include a demodulating circuit 111, digital PLL 112, and a Central Processing Unit (CPU) 113.

The demodulating circuit 111 generates the power necessary for the operation of the non-contact IC chip 101, based on an RF input signal supplied from an unshown antenna having received electromagnetic waves from an unshown reader/writer, and supplies the generated power to the various units, at the same time outputting to the digital PLL 112 a demodulating signal (hereafter also called signal DATA) serving as a 1696 kbps (kilobits per second) digital signal subjected, to PSK modulation by subjecting the bit row, which is a demodulated signal obtained by demodulating the RF input signal and is original data, to Manchester encoding.

Figure 1:
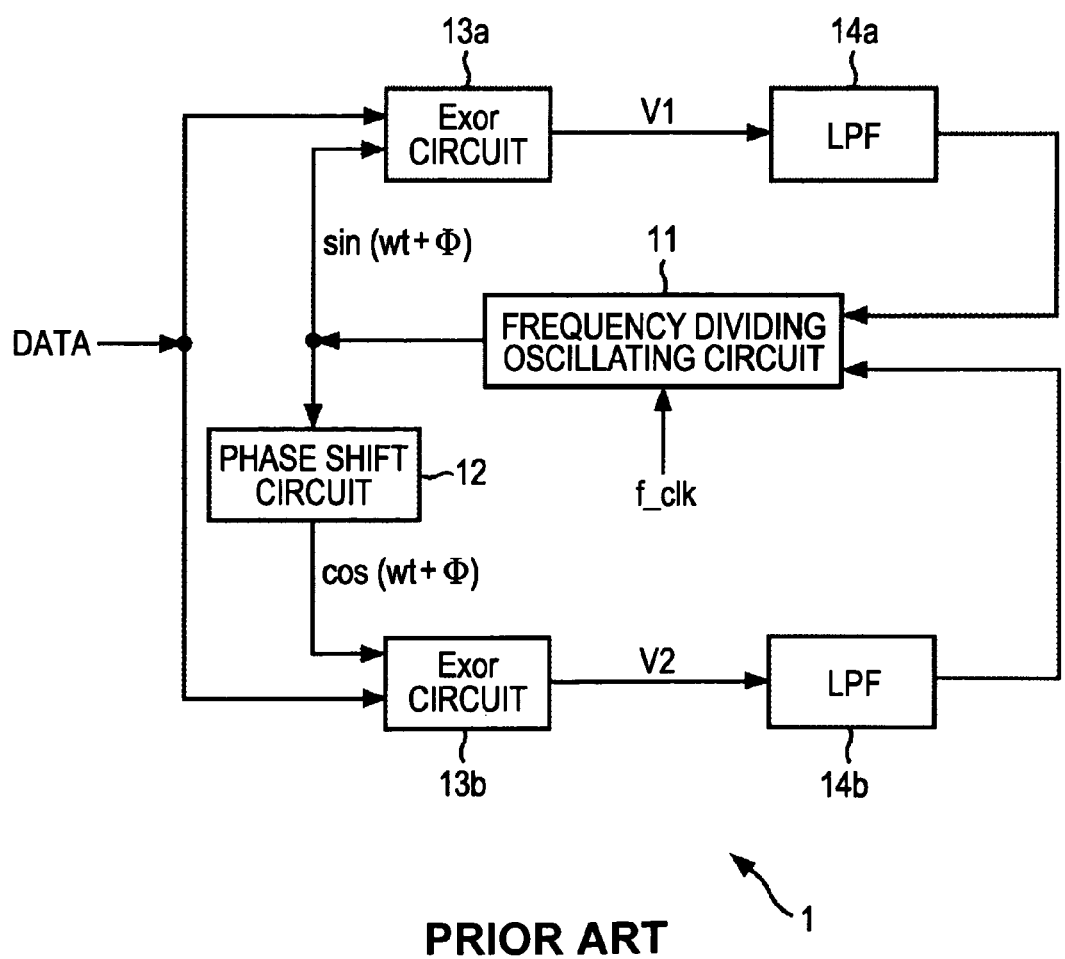
FIG. 1 is a circuit diagram illustrating an example of a traditional digital PLL.
Figure 3:
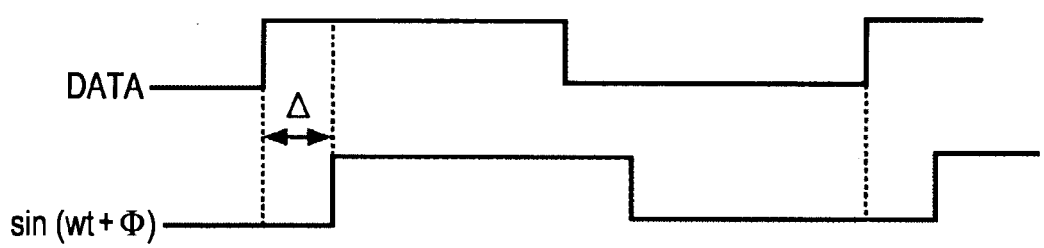
FIG. 3 is a diagram to describe an overview of the processing of the digital PLL in FIG. 2.

As with the digital PLL 1 in FIG. 1, as shown in FIG. 3, the digital PLL 112 is an operating clock of the signal DATA input from the demodulating circuit 111 and the non-contact IC chip input from an unshown oscillating circuit, whereby a control angle Φ is controlled so that the phase difference Δ between the signal sin(wt+Φ) generated by dividing the clock signal f_clk wherein the clock frequency is 13.56 MHz becomes 0. However, as will be described later, the digital PLL 112 is not to directly control the sin (wt+Φ), but by controlling the values of cos-para serving as a parameter corresponding to cos Φ, and sin-para serving as a parameter sin Φ in the case of expanding sin(wt+Φ), as shown below (Expression 1), whereby the phases of the control angle Φ and the signal sin(wt+Φ) can be controlled virtually.

$$\sin(wt+\Phi)=\cos\Phi\times\sin(wt)+\sin\Phi\times\cos(wt) \qquad (1)$$

Figure 4:
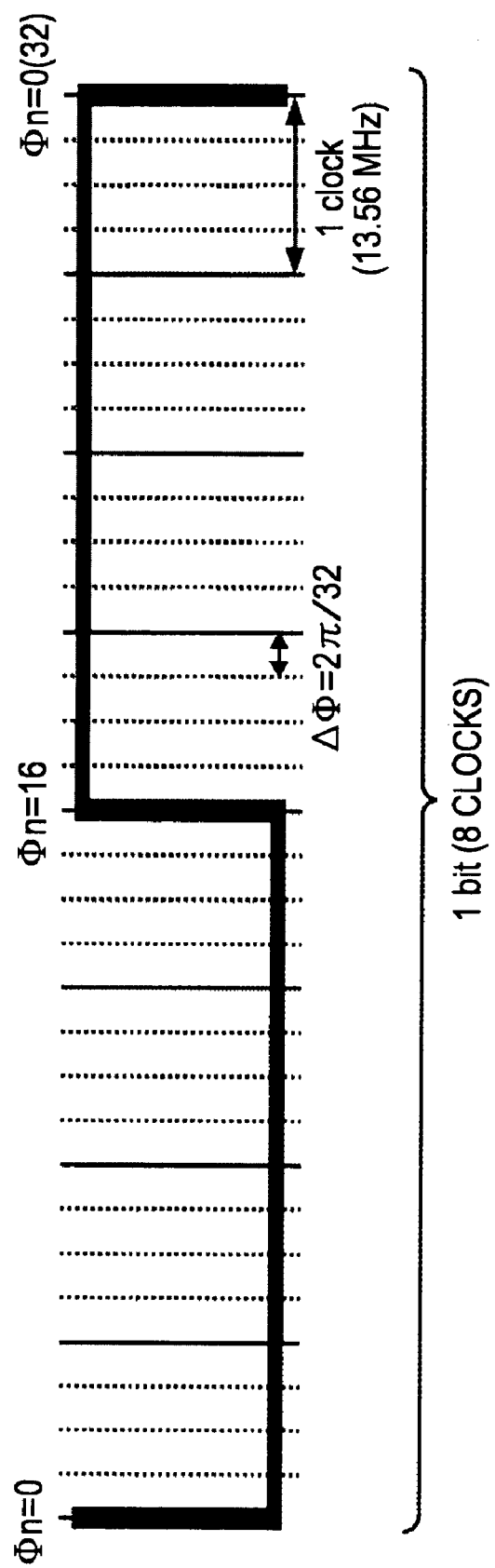
FIG. 4 is a diagram to describe an overview of the processing of the digital PLL in FIG. 2.

Also, with the digital PLL 112, the bit rate of the signal DATA to be input is 1696 kbps, whereas the clock frequency of the clock signal f_clk to be input in the frequency divider 131 is 13.56 MHz, so a clock signal f_clk of eight clocks worth is assigned to one bit of the signal DATA, i.e. one cycle of signal DATA. As will be described later, with the digital PLL 112, as is shown in FIG. 4, the phase resolution wherein one clock is further divided into four, i.e. a resolution of 2Π/32 wherein one cycle of signal DATA is divided into thirty-two is realized. Note that the width of the resolution is expressed as ΔΦ (=2Π/32), and the control angle is expressed as Φ=Φn×ΔΦ (Φn is an integer from 0 to 31).

Further, the digital PLL 112 controls the timing for reading data from the signal DATA in order to extract a bit row before PSK modulation, i.e. in order to restore the data before PSK modulation, based on the value of Φn, i.e. based on the virtual control angle Φ. Specifically, the digital PLL 112 generates a timing signal indicating timing to read the data from the signal DATA based on the value of Φn, and supplies this to the CPU 113.

The CPU 113 reads the data from the signal DATA based on the timing signal supplied from the clock signal f_clk and the digital PLL 112, thereby restoring the data before PSK modulation, and performs predetermined processing such as reading/writing of the data stored in an unshown non-volatile memory, based on the restored data.

FIGS. 5 and 6 are circuit diagrams illustrating an example of the configuration of the digital PLL 112 in FIG. 2. Hereafter, in order to distinguish between the digital PLL 122 in FIGS. 5 and 6, the digital PLL 112 in FIG. 5 will be called a digital PLL 112a, and the digital PLL 112 in FIG. 6 will be called a digital PLL 112b. Also, in the event that there is no particular need to distinguish between the digital PLL 112a and the digital PLL 112b, this will simply be called the digital PLL 112.

The digital PLL 112a in FIG. 5 is made up of a frequency divider 131, Exor circuits 132a and 132b, multipliers 133a-1 through 133b-2, adders 134a and 134b, LPFs 135a and 135b, and an Amplitude Controlled Transfer (ACT) 136.

The frequency divider 131 generates a signal sin(wt) serving as a 1696 kHz clock signal which is of a frequency almost equivalent to the signal DATA, and a signal cos(wt) serving as a 1696 kHz clock signal wherein the phase of the signal sin(wt) differs by just Π/2, or more accurately, the phase is delayed by just Π/2, based on the 13.56-MHz clock signal f_clk input from the unshown oscillation circuit. The frequency divider 131 supplies the signal sin(wt) to the Exor circuit 132a, and supplies the signal cos(wt) to the Exor circuit 132b.

The Exor circuit 132a generates a signal DATA×sin(wt) wherein the signal DATA input from the demodulating circuit 111 and the exclusive-OR (Exor) of the signal sin(wt) are inverted, and supplies this to the multipliers 133a-1 and 133b-1.

The Exor circuit 132b generates a signal DATA×cos(wt) wherein the signal DATA input from the demodulating circuit 111 and the Exor of the signal cos(wt) are inverted, and supplies this to the multipliers 133a-2 and 133b-2.

The multiplier 133a-1 multiplies a parameter cos_para supplied from the ACT 136 to the signal DATA×sin(wt), assuming a Hi level value of the signal DATA×sin(wt) to be +1 and a Low level value thereof to be −1, generates a signal cos_para×DATA×sin(wt) to indicate the multiplied value cos_para×DATA×sin(wt), and supplies this to the adder 134a.

The multiplier 133a-2 multiplies a parameter sin_para supplied from the ACT 136 to the signal DATA×cos(wt), assuming a Hi level value of the signal DATA×cos(wt) to be +1 and a Low level value thereof to be −1, generates a signal sin_para×DATA×cos(wt) to indicate the multiplied value sin_para×DATA×cos(wt), and supplies this to the adder 134a.

The multiplier 133b-1 multiplies a parameter cos_para supplied from the ACT 136 to the signal DATA×sin(wt), assuming a Hi level value of the signal DATA×sin(wt) to be +1 and a Low level value thereof to be −1, generates a signal sin_para×DATA×sin(wt) to indicate the multiplied value sin_para×DATA×sin(wt), and supplies this to the adder 134b.

The multiplier 133b-2 multiplies a parameter cos_para supplied from the ACT 136 to the signal DATA×cos(wt), assuming a Hi level value of the signal DATA×cos(wt) to be +1 and a Low level value thereof to be −1, generates a signal cos_para×DATA×cos(wt) to indicate the multiplied value cos_para×DATA×cos(wt), and supplies this to the adder 134b.

The adder 134a adds together the value cos_para×DATA×sin(wt) and the value sin_para×DATA×cos(wt) to generate a signal V11 indicating an added value V11 (=cos_para×DATA×sin(wt)+sin_para×DATA×cos(wt)), and supplies this to the LPF 135a.

Note that upon expanding of the value V1 which is input in the LPF 14a of the digital PLL 1 in FIG. 1 as described above, this becomes as the following Expression (2), and the value V11 becomes a value wherein the cos Φ and sin Φ of the final expression become values replaced with cos_para and sin_para, respectively.

$$V1=(DATA \times \sin(wt+\Phi))=$$

$$\cos \Phi \times DATA \times \sin(wt) + \sin \Phi \times DATA \times \cos(wt) \quad (2)$$

The adder 134b adds a value wherein the sign of the value sin_para×DATA×sin(wt) is inverted, and the value cos_para×DATA×cos(wt) to generate a signal V12 indicating an added value V12 (=−sin_para×DATA×sin(wt)+cos_para×DATA×cos (wt)), and supplies this to the LPF 135b.

Note that upon expanding of the value V2 which is input in the LPF 14b of the digital PLL 1 in FIG. 1 as described above, this becomes as the following Expression (3), and the value V12 becomes a value wherein the cos Φ and sin Φ of the final expression in Expression (3) become values replaced with cos_para and sin_para, respectively.

$$V2=(DATA \times \cos(wt+\Phi))=$$

$$=-\sin \Phi \times DATA \times \sin(wt) + \cos \Phi \times DATA \times \cos(wt) \quad (3)$$

The LPF 135a cumulatively adds the value V11, and supplies a signal ΣV11 indicating the value ΣV11 (=Σ{ cos-para×DATA×sin(wt)+sin_para×DATA×cos(wt)}) wherein the value V11 is cumulatively added over the period of 8 clocks worth of the clock signal f_clk, i.e., 1 cycle of the signal DATA, to the ACT 136. Upon supplying the signal V11, the value held by the LPF 135a is reset, and the LPF 135a cumulatively adds the value V11 again from 0. That is to say, for every cycle of the signal DATA, the LPF 135a cumulatively adds the value V11 of one cycle worth, and supplies the signal ΣV11 indicating the cumulatively added value ΣV11 to the ACT 136.

Similarly, the LPF 135b cumulatively adds the value V12 of one cycle worth for every cycle of the signal DATA, and supplies the signal ΣV12 indicating the cumulatively added value ΣV12 to the ACT 136.

Note that for one cycle of the signal DATA, the value ΣV11 shows the results of comparing the phases of the virtual signal sin(wt+Φ) wherein the signal sin(wt) is phase-shifted by an amount equal to the virtual control angle Φ, and the signal DATA. For example, in the event that a duty ratio for the signal DATA is 50%, in the event that the phases of the signal sin(wt+Φ) and the signal DATA are identical, the value ΣV11 is at its greatest level, and in the event that the phases of the signal sin(wt+Φ) and the signal DATA differ by Π/2, the value ΣV11 becomes 0, and in the event that the phases of the signal sin(wt+Φ) and the signal DATA differ by Π, the value ΣV11 is at its lowest level.

Also, for one cycle of the signal DATA, the value ΣV12 shows the results of comparing the phases of the virtual signal cos(wt+Φ) wherein the signal cos(wt) is phase-shifted by an amount equal to the virtual control angle Φ, and the signal DATA. For example, in the event that a duty ratio for the signal DATA is 50%, in the event that the phases of the signal cos(wt+Φ) and the signal DATA are identical, the value ΣV12 is at its greatest level, and in the event that the phases of the signal cos(wt+Φ) and the signal DATA differ by Π/2, the value ΣV12 becomes 0, and in the event that the phases of the signal cos(wt+Φ) and the signal DATA differ by Π/2, the value ΣV12 is at its lowest level.

The ACT 136 controls the values of cos_para and sin_para, based on the signal ΣV11 and the signal ΣV12. The ACT 136 supplies the signal showing the value of the controlled cos_para to the multipliers 133a-1 and 133b-2, and supplies the signal showing the value of the controlled sin_para to the multipliers 133a-2 and 133b-1. Also, the ACT 136 generates a timing signal showing the timing to read the data from the signal DATA, based on the signal ΣV11 and the signal ΣV12, and supplies this to the CPU 113.

Note that with the digital PLL 112a in FIG. 5, the adders 134a and 134b and the LPF 135a and 135b perform linear computing, so the positions of the adder 134a and LPF 135a, and the positions of the adder 134b and LPF 135b, can be interchanged. The digital PLL 112b is configured by interchanging the positions of the adder 134a and LPF 135a, and the adder 134b and LPF 135b, according to the digital PLL 112a in FIG. 5.

The digital PLL 112b in FIG. 6 is made up of a frequency divider 131, Exor circuits 132a and 132b, multipliers 133a-1 through 133b-2, ACT 136, LPF 161a-1 through 161b-2, and adders 162a and 162b. Note that for portions corresponding to FIG. 5 have the same reference numerals, in the drawing have been denoted with the same reference numerals, and redundant description of the portions with similar processing will be omitted.

The LPF 161a-1 cumulatively adds the value cos_para×DATA×sin(wt), and supplies a signal Σ{ cos_para×DATA×sin(wt)} indicating the value Σ{ cos_para×DATA×sin(wt)} wherein the value cos_para×DATA×sin(wt) is cumulatively added over the period of 8 clocks worth of the clock signal f_clk, i.e., 1 cycle of the signal DATA, to the adder 162a. Upon supplying the signal Σ{ cos_para×DATA×sin(wt)}, the value held by the LPF 161*a*-1 is reset, and the LPF 161*a*-1 cumulatively adds the value cos_para×DATA×sin(wt) again from 0. That is to say, for every cycle of the signal DATA, the LPF 161*a*-1 cumulatively adds the value cos_para×DATA× sin(wt) of one cycle worth, and supplies the signal Σ{ cos_para×DATA×sin(wt)} indicating the cumulatively added value Σ{ cos_para×DATA×sin(wt)} to the adder 162*a*.

In the same way, for every cycle of the signal DATA, the LPF 161*a*-2 cumulatively adds the value sin_para×DATA× cos(wt) of one cycle worth, and supplies the signal Σ{ sin_ para×DATA×cos(wt)} indicating the cumulatively added value Σ{ sin-para×DATA×cos(wt)} to the adder 162*a*. Also similarly, for every cycle of the signal DATA, the LPF 161*b*-1 cumulatively adds the value sin_para×DATA×sin(wt) of one cycle worth, and supplies the signal Σ{ sin_para×DATA×sin (wt)} indicating the cumulatively added value Σ{ sin-para× DATA×sin(wt)} to the adder 162*b*. Further, similarly, for every cycle of the signal DATA, the LPF 161*b*-2 cumulatively adds the value cos_para×DATA×cos(wt) of one cycle worth, and supplies the signal Σ{ cos_para×DATA×cos(wt)} indicating the cumulatively added value Σ{ cos-para×DATA×cos (wt)} to the adder 162*b*.

The adder 162*a* adds the value Σ{cos_para×DATA×sin (wt)} and the value Σ{ sin_para×DATA×cos(wt)} for every cycle of the signal DATA to generate a signal ΣV11 indicating the added value V11 (=Σ{ cos_para×DATA×sin(wt)+sin_ para×DATA×cos(wt)}), and supplies this to the ACT 136.

The adder 162*b* adds a value wherein the sign of the value Σ{ sin_para×DATA×sin(wt)} is inverted, and the value Σ{ cos_para×DATA×cos(wt)} for every cycle of the signal DATA to generate a signal ΣV12 indicating the added value V12 (=Σ{-sin_para×DATA×sin(wt)+cos_para×DATA×cos (wt)}), and supplies this to the ACT 136.

Figures 7, 8:
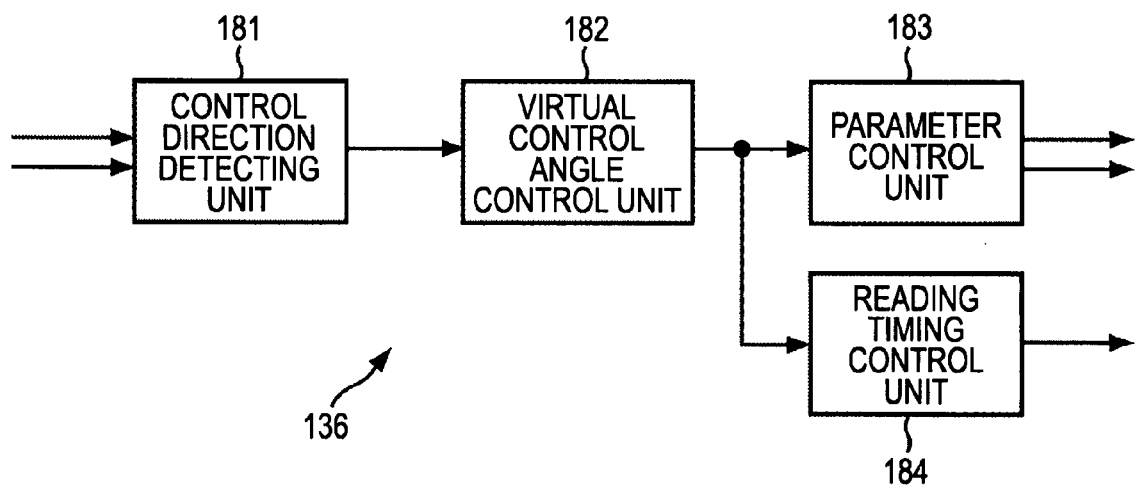
FIG. 7 is a block diagram illustrating a functional configuration of the ACT in FIGS. 5 and 6.
FIG. 8 is a chart illustrating an example of the direction of control.

FIG. 7 is a block diagram showing a functional configuration of the ACT 136 in FIGS. 5 and 6. The ACT 136 is configured so as to include a control direction setting unit 181, a virtual control angle control unit 182, a parameter control unit 183, and a reading timing control unit 184.

The control direction setting unit 181 sets the direction to control a virtual control angle Φ using the chart shown in FIG. 8, based on the value ΣV11 indicated by the signal ΣV11 and the value ΣV12 indicated by the signal ΣV12. Specifically, based on the chart shown in FIG. 8, the control direction is set in the + direction in the event that the signs of the value ΣV11 and the value ΣV12 are the same, and the control direction is set in the − direction in the event that the signs of the value ΣV11 and the value ΣV12 differ, or in the event that the value ΣV11 is 0 and the value ΣV12 is not 0, but in the event that the value ΣV12 is 0, regardless of the value ΣV11, the control direction is set to be 0, i.e., so as not to change the control angle Φ. That is to say, the control direction setting unit 181 sets the control direction of the control angle Φ so that the value ΣV12 becomes 0. The control direction setting unit 181 notifies the set control direction to the virtual control angle control unit 182.

The virtual control angle control unit 182 controls a virtual control angle Φ, based on the control direction set by the control direction setting unit 181. Specifically, in the event that the control direction is set in the +direction, the virtual control angle control unit 182 increments the value of Φn by 1. That is to say, the virtual control angle Φ is increased by an amount equal to ΔΦ, and the phase of the virtual signal sin(wt+φ) is delayed by an amount equal to ΔΦ. Also, in the event that the control direction is set in the − direction, the virtual control angle control unit 182 decrements the value of Φn by 1. That is to say, the virtual control angle Φ is decreased by an amount equal to ΔΦ, and the phase of the virtual signal sin(wt+φ) is advanced by an amount equal to ΔΦ. Further, in the event that the control direction has been set to 0, the virtual control angle control unit 182 does not change the value of Φn. That is to say, the phases of the signal DATA and the virtual signal sin(wt+φ) are determined to be in a synchronous state, so the control angle Φ is not changed. The virtual control angle control unit 182 notifies the value of the controlled Φn to the parameter control unit 183 and the reading timing control unit 184.

The parameter control unit 183 controls the values of cos_para and sin_para, using the chart shown in FIG. 9, based on the value of an, i.e. based on the virtual control angle Φ. As shown in FIG. 9, as the value of cos_para corresponds to cos Φ serving as the cosine of the control angle Φ, the value of cos_para is at its greatest when Φn=0, i.e., the control angle Φ=0, the value of cos_para monotonically decreases when Φn=0 through 16, i.e., in the section of the control angle Φ=0 through 11, the value of cos_para becomes 0 when Φn=8, i.e. the control angle Φ=Π/2, the value of cos_para is at its least when Φn=16, i.e. the control angle Φ=Π, and the value of cos_para monotonically increases when Φn=16, 17, . . . , 31, 0 i.e., in the section wherein the control angle Φ=Π through 2Π (0), and Φn=24 i.e., and the value of cos_para becomes 0 with the control angle Φ=3Π/2.

Also, as the value of sin_para corresponds to sin Φ serving as the sine of the control angle Φ, the value of sin_para is 0 when Φn=0, i.e., the control angle Φ=0, the value of sin_para monotonically increases when Φn=0 through 8, i.e., in the section wherein the control angle Φ=Π/2, the value of sin_ para is at its greatest when Φn=8, i.e., the control angle Φ=Π/2, the value of sin_para monotonically decreases when Φn=8 through 24, i.e., in the section wherein the control angle Φ=Π/2 through 3Π/2, the value of sin-para becomes 0 when Φn=16, i.e., the control angle Φ=Π/, the value of sin_para is at its least when Φn=24, i.e. the control angle Φ=3Π/2, and the value of sin_para monotonically increases when Φn=24, 25, . . . , 31, 0 i.e., in the section wherein the control angle Φ=3π/2 through 2Π (0).

The parameter control unit 183 supplies a signal indicating the value of the controlled cos_para to the multipliers 133*a*-1 and 133*b*-2, and supplies a signal indicating the value of the controlled sin_para to the multipliers 133*a*-2 and 133*b*-1.

The reading timing control unit 184 uses the chart shown in FIG. 10 to control the timing for the CPU 113 to read the data from the signal DATA, based on the value of Φn, i.e., based on the virtual control angle Φ. Specifically, based on the chart shown in FIG. 10, the reading timing control unit 184 sets the timing for reading data from the signal DATA wherein the clock counter of the clock signal f_clk is 0 (hereafter will also be simply called clock counter) in the event that the value of Φn is 1 through 4, i.e., in the event that the control angle Φ is in the range of 1×ΔΦ through 4×ΔΦ, and sets the timing of the clock counter to 1 in the event that the value of Φn is 5 through 8, i.e. the control angle Φ is in the range of 5×ΔΦ through 8×ΔΦ, and sets the timing of the clock counter to 2 in the event that the value of Φn is 9 through 12, i.e. the control angle Φ is in the range of 9×ΔΦ through 12×ΔΦ, and sets the timing of the clock counter to 3 in the event that the value of Φn is 13 through 16, i.e. the control angle Φ is in the range of 13×ΔΦ through 16×ΔΦ, and sets the timing of the clock counter to 4 in the event that the value of Φn is 17 through 20, i.e. the control angle Φ is in the range of 17×ΔΦ through 20×ΔΦ, and sets the timing of the clock counter to 5 in the event that the value of Φn is 21 through 24, i.e. the control angle Φ is in the range of 21×ΔΦ through 24×ΔΦ, and sets the timing of the clock counter to 6 in the event that the value of Φn is 25 through 28, i.e. the control angle Φ is in the range of 25×ΔΦ through 28×Φ, and sets the timing of the clock counter to 7 in the event that the value of Φn is 29, 30, 31, or 0, i.e. the control angle Φ is in the range of 29×ΔΦ through 31×ΔΦ or is at 0.

That is to say, in the event that the duty ratio of the signal DATA is at 50%, control is performed so that value at approximately the center of the first half of each bit of signal DATA is read according to the phase of the signal DATA.

The reading timing control unit 184 supplies the timing signal showing the value of the clock counter which has been set to the CPU 113. Note that the clock counter of the clock signal f_clk is to repeat the values 0 through 7.

Next, the processing of the digital PLL 112 will be described in detail with reference to FIGS. 11 and 12. Hereafter, in order to simplify the description, the processing of the digital PLL 112*b* in FIG. 6 will be primarily described.

Figure 11:
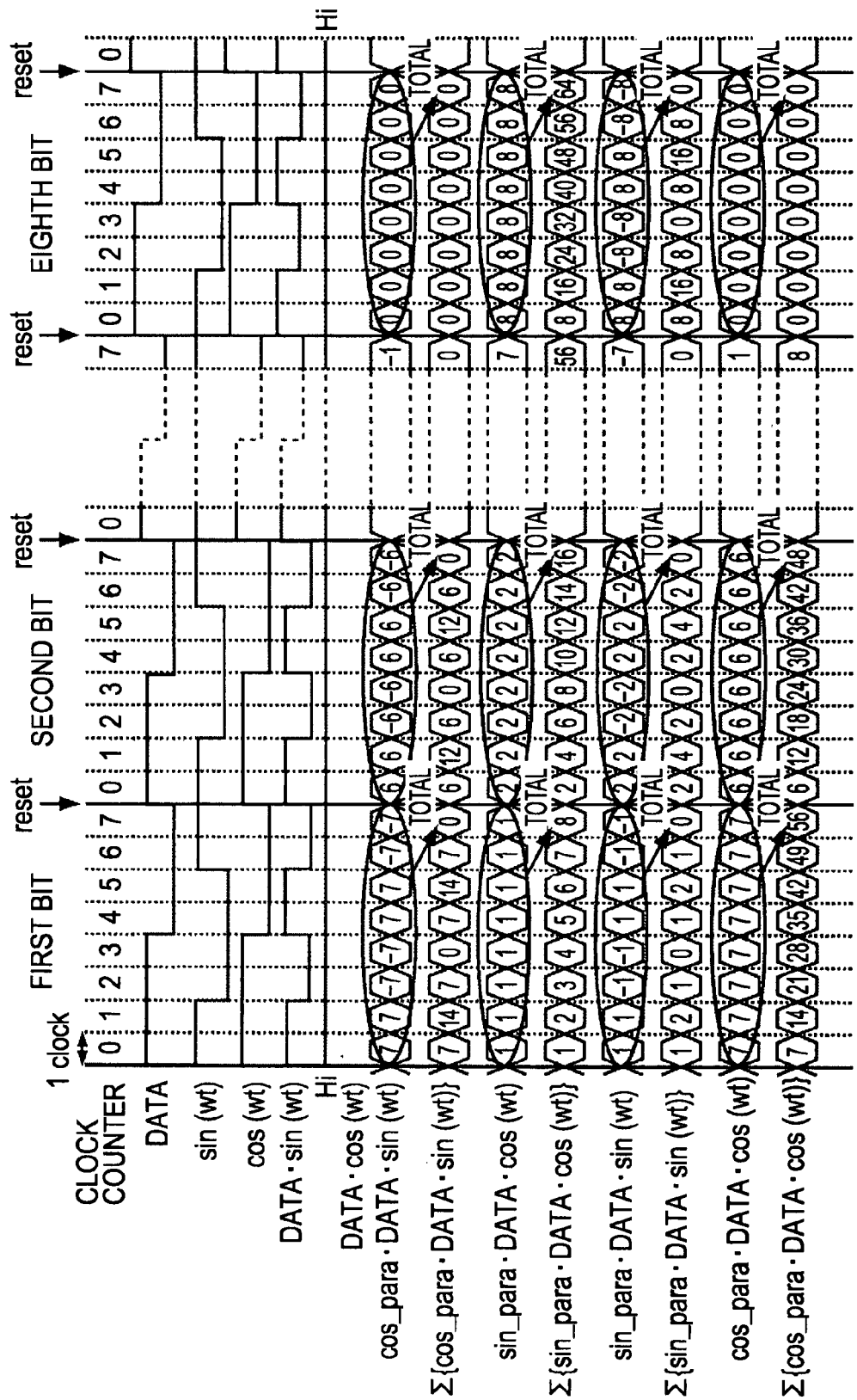
FIG. 11 is a diagram for describing the operation of the digital PLL in FIGS. 5 and 6.

Note that as shown in FIG. 11, a situation where the signal DATA is input in the digital PLL 112*b* at a timing wherein the phase is delayed by Π/2 from sin(wt), and is the same phase as cos(wt), will be considered. Also, the value of Φn when the signal DATA is input in the digital PLL 112*b* is assumed to be 1. That is to say, a situation is considered wherein the signal DATA is input where the virtual control angle Φ=1×ΔΦ and the phase of the virtual signal sin(wt+φ) is wt+1×ΔΦ. Further, Φn=1, so the value of cos_para is assumed to be controlled as 7 by the parameter control unit 183 and the value of sin_para is assumed to be controlled as 1, based on the chart shown in the above-described FIG. 9.

First, the processing for the digital PLL 112*b* for the first bit of signal DATA will be described. With the processing of the first bit, the signal DATA×sin(wt) output from the Exor circuit 132*a* is Hi in the period wherein the clock counter is from 0 to 1, becomes Low in the period from 2 to 3, becomes Hi in the period from 4 to 5, and becomes Low in the period from 6 to 7.

Also, the signal DATA×cos(wt) output from the Exor circuit 132*b* is Hi in all of the periods wherein the clock counter is from 0 to 7.

Accordingly, the value of the signal cos_para×DATA×sin (wt) output from the multiplier 133*a*-1 becomes 7 in the period wherein the clock counter is from 0 to 1, becomes −7 in the period from 2 to 3, becomes 7 in the period from 4 to 5, and becomes −7 in the period from 6 to 7. Thus, the value of the signal Σ{ cos_para×DATA×sin(wt)} output from the LPF 161*a*-1 becomes 0 at the point when the clock counter is at 7.

Also, the value of the signal sin_para×DATA×cos(wt) output from the multiplier 133*a*-2 becomes 1 in all of the periods wherein the clock counter is from 0 to 7. Thus, the value of the signal Σ{ sin_para×DATA×cos(wt)} output from the LPF 161*a*-2 becomes 8 at the point when the clock counter is at 7.

Also, the value of the signal sin_para×DATA×sin(wt) output from the multiplier 133*b*-1 becomes 1 in the period wherein the clock counter is from 0 to 1, becomes −1 in the period from 2 to 3, becomes 1 in the period from 4 to 5, and becomes −1 in the period from 6 to 7. Thus, the value of the signal Σ{ sin_para×DATA×sin(wt)} output from the LPF 161*b*-1 becomes 0 at the point when the clock counter is at 7.

Also, the value of the signal cos_para×DATA×cos(wt) output from the multiplier 133*b*-2 becomes 7 in all of the periods wherein the clock counter is from 0 to 7. Thus, the value of the signal Σ{ cos_para×DATA×cos(wt)} output from the LPF 161*b*-2 becomes 56 at the point when the clock counter is at 7.

Further, the value of the signal Σ{ cos_para×DATA×sin (wt)} is 0 and the value of the signal Σ{ sin_para×DATA×cos (wt)} is 8 at the point when the clock counter is 7, so the value of the signal ΣV11 output from the adder 162*a* becomes 8.

Also, the value of the signal Σ{ sin_para×DATA×sin(wt)} is 0 and the value of the signal Σ{ cos_para×DATA×cos(wt)} is 56 at the point when the clock counter is 7, so the value of the signal ΣV11 output from the adder 162*a* becomes 56.

Accordingly, the control direction setting unit 181 sets the control direction thereof to the + direction, based on the signs of the signal ΣV11 and the signal ΣV12, using the chart shown in FIG. 8.

As the control direction thereof is set to the + direction, the virtual control angle control unit 182 increments the value of Φn from 1 to 2.

As the value of Φn is changed to 2, the parameter control unit 183 controls the value of the signal cos_para to be changed to 6 and the value of the signal sin_para to be changed to 2 based on the chart shown in FIG. 9.

As the value of Φn is changed to 2, the reading timing control unit 184 generates a timing signal wherein the value of the clock counter reading the data from the signal DATA is set to 7, based on the chart shown in FIG. 10, and supplies this to the CPU 113. That is to say, the reading timing control unit 184 controls the CPU 113 to read the data from the signal DATA at the point when the clock counter of the clock signal f_clk is 7 at the next bit of the signal DATA, which is now the second bit.

The LPFs 161*a*-1 through 161*b*-2 reset the values held at the point of the clock counter being at 7.

With the second bit of the signal DATA, similar processing is performed, and at the point when the clock counter is 7, the value Σ{ cos_para×DATA×sin(wt)} becomes 0, the value Σ{ sin_para×DATA×cos(wt)} becomes 16, the value Σ{ sin_para×DATA×sin(wt)} becomes 0, the value Σ{ cos_para× DATA×cos(wt)} becomes 48, the value ΣV11 becomes 8, and the value ΣV12 becomes 48.

Accordingly, the control direction is set to the + direction based on the chart shown in FIG. 8, the value of Φn is incremented from 2 to 3 based on the chart shown in FIG. 10, control is performed so that the value of cos_para is 5 and the value of sin_para is 3, based on the chart shown in FIG. 9, and the value of the clock counter reading the data from the signal DATA is controlled to be 0.

Figure 12:
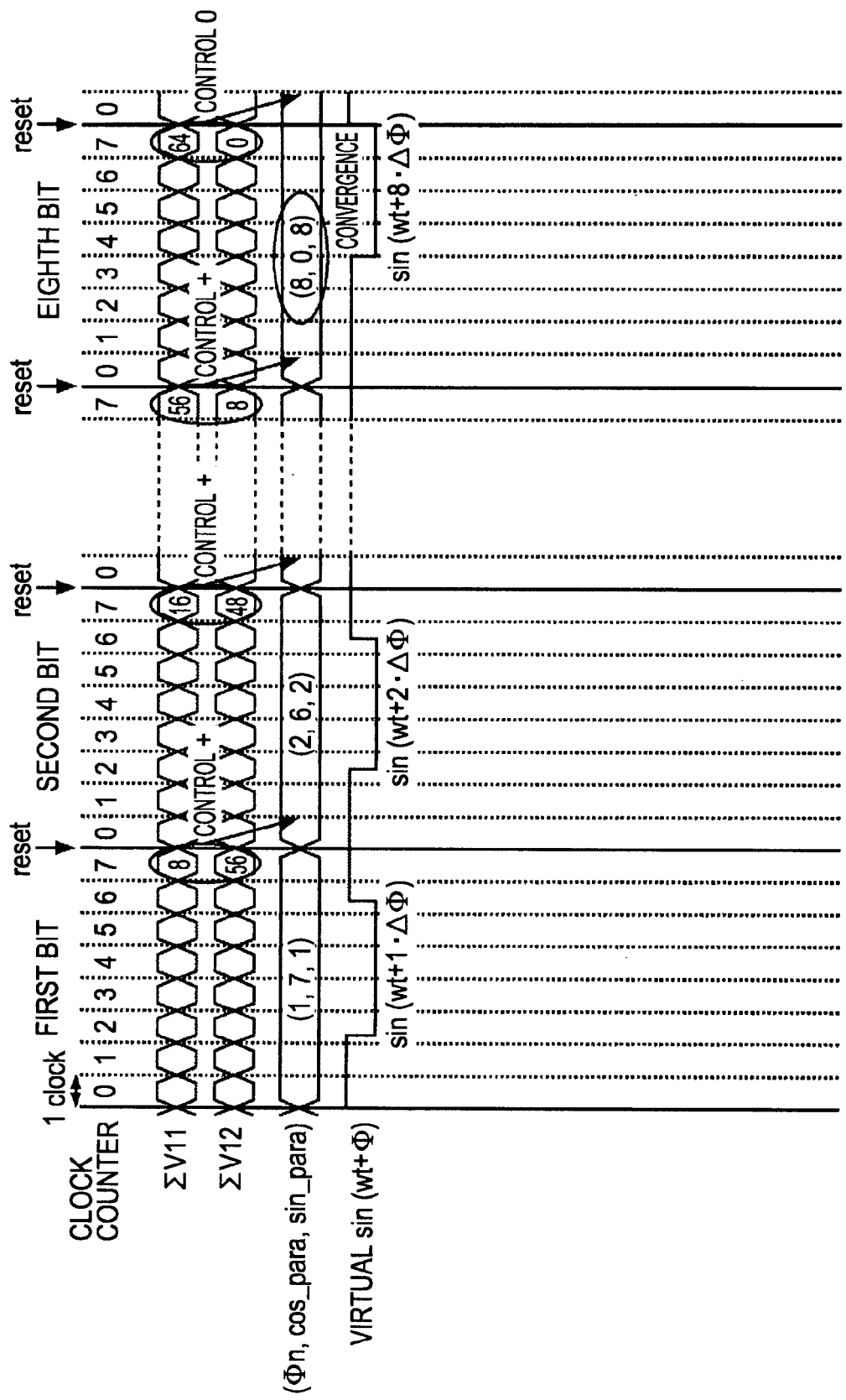
FIG. 12 is a diagram for describing the operation of the digital PLL in FIGS. 5 and 6.

Hereafter, the same processing is repeated, and as shown in FIGS. 11 and 12, with the processing of the seventh bit of the signal DATA, the value of Φn is set to 8, the value of cos_para is set to 0, and the value of sin_para is set to 8, and with the processing of the eighth bit, the value Σ{ cos_para×DATA× sin(wt)} becomes 0, the value Σ{ sin_para×DATA×cos(wt)} becomes 64, the value Σ{ sin_para×DATA×sin(wt)} becomes 0, the value Σ{ cos_para×DATA×cos(wt)} becomes 0, the value ΣV11 becomes 64, and the value ΣV12 becomes 0.

Accordingly, the control direction is set to 0, based on the chart shown in FIG. 8. That is to say, the phases of the signal DATA and the virtual signal sin(wt+φ) are determined to have synchronized, i.e., the control of the phases by the digital PLL 112*b* is determined to have converged, and the virtual control angle Φ is locked as 8×ΔΦ. Also, the value of cos_para is locked as 0, and the value of sin_para is locked as 8, and the value of the clock counter reading data from the signal DATA is locked as 1.

Thus, the digital PLL 112*b* uses the clock signal f_clk having the same clock frequency as the digital PLL 1 in FIG. 1, i.e. improves phase resolution without increasing clock frequency, and can improve data receiving precision. In other words, the original data can be restored more accurately without increasing the clock frequency. Accordingly, the communication quality can be improved, or a higher transfer rate while retaining communication quality can be handled, without increasing the clock frequency.

Note that above description has been made regarding processing of the digital PLL 112b, but by controlling the values of cos_para and sin_para for the digital PLL 112a also, with similar processing as the digital PLL 112b, the control angle Φ is virtually controlled, and the timing for reading the data from the signal DATA is controlled in accordance with the virtual control angle Φ.

Note that with the digital PLL 112, the timing input by the signal DATA for the signal sin(wt) and the signal cos(wt) has eight patterns in all, as in FIGS. 13 through 20.

Figure 13:
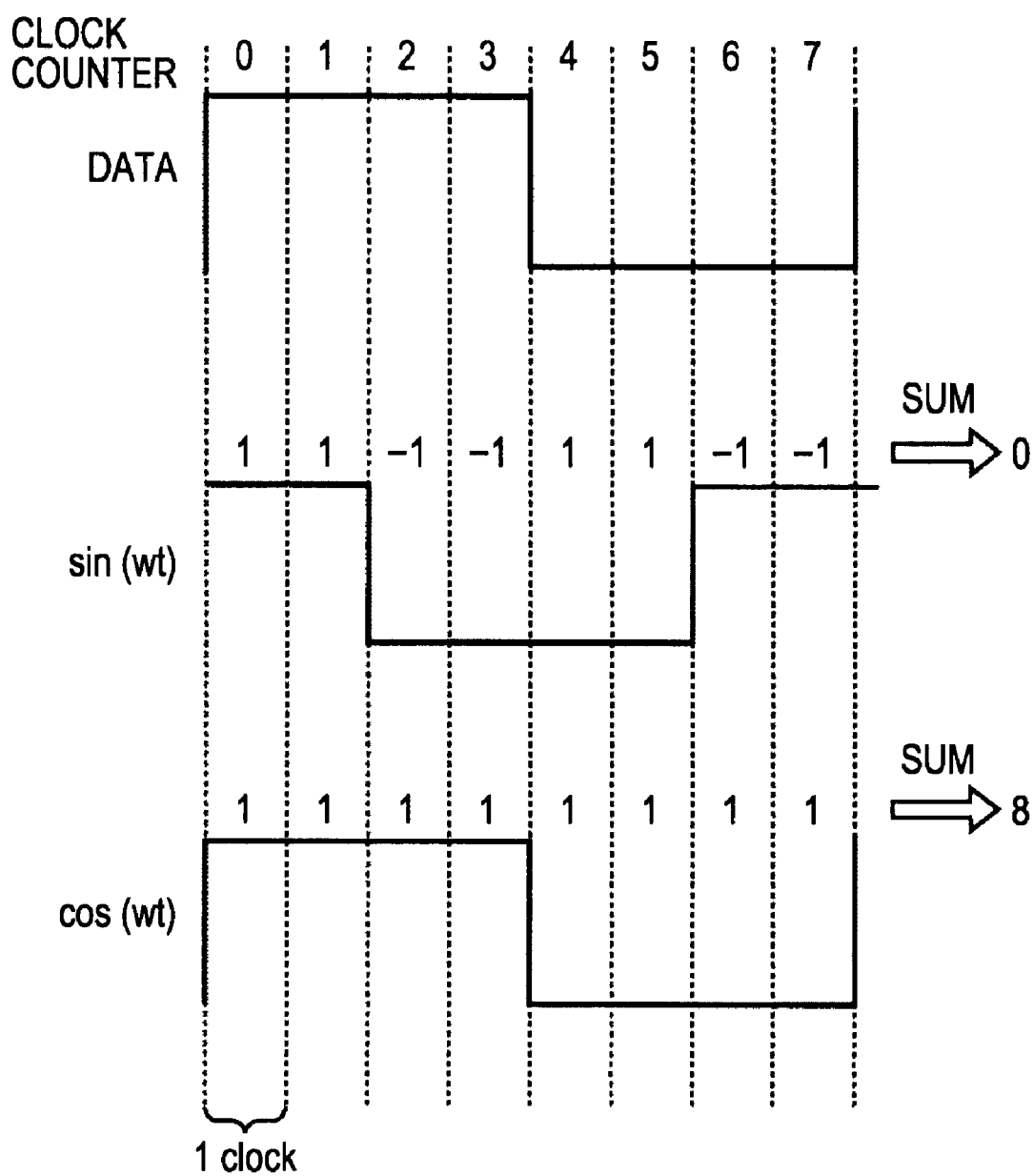
FIG. 13 is a diagram for illustrating a first pattern for timing of signal DATA to be input as to signals sin(wt) and cos(wt)

The first pattern shown in FIG. 13 is a pattern wherein signal DATA is input in the digital PLL 112 with the phase being Π/2 delayed from the signal sin(wt) and having the same phase as the signal cos(wt). This is the same pattern as in the above-described FIGS. 11 and 12. With the first pattern, in the event that the Hi level value of the signal DATA×sin(wt) output from the Exor circuit 132a is assumed to be +1, and the Low level value is assumed to be −1, and the Hi level value of the signal DATA×cos(wt) output from the Exor circuit 132b is assumed to be +1 and the Low level value is assumed to be −1, the value Σ{DATA×sin(wt)}wherein the signal DATA×sin (wt) is added over one cycle worth of signal DATA becomes 0, and the value Σ{DATA×cos(wt)} wherein the signal DATA×sin(wt) is added over one cycle worth of signal DATA becomes 8. Also, in the event that signal DATA is input with the timing shown in the first pattern, the value of Φn converges to 8 or 24, according to the value of Φn at the time of the input of signal DATA being started.

Figure 14:
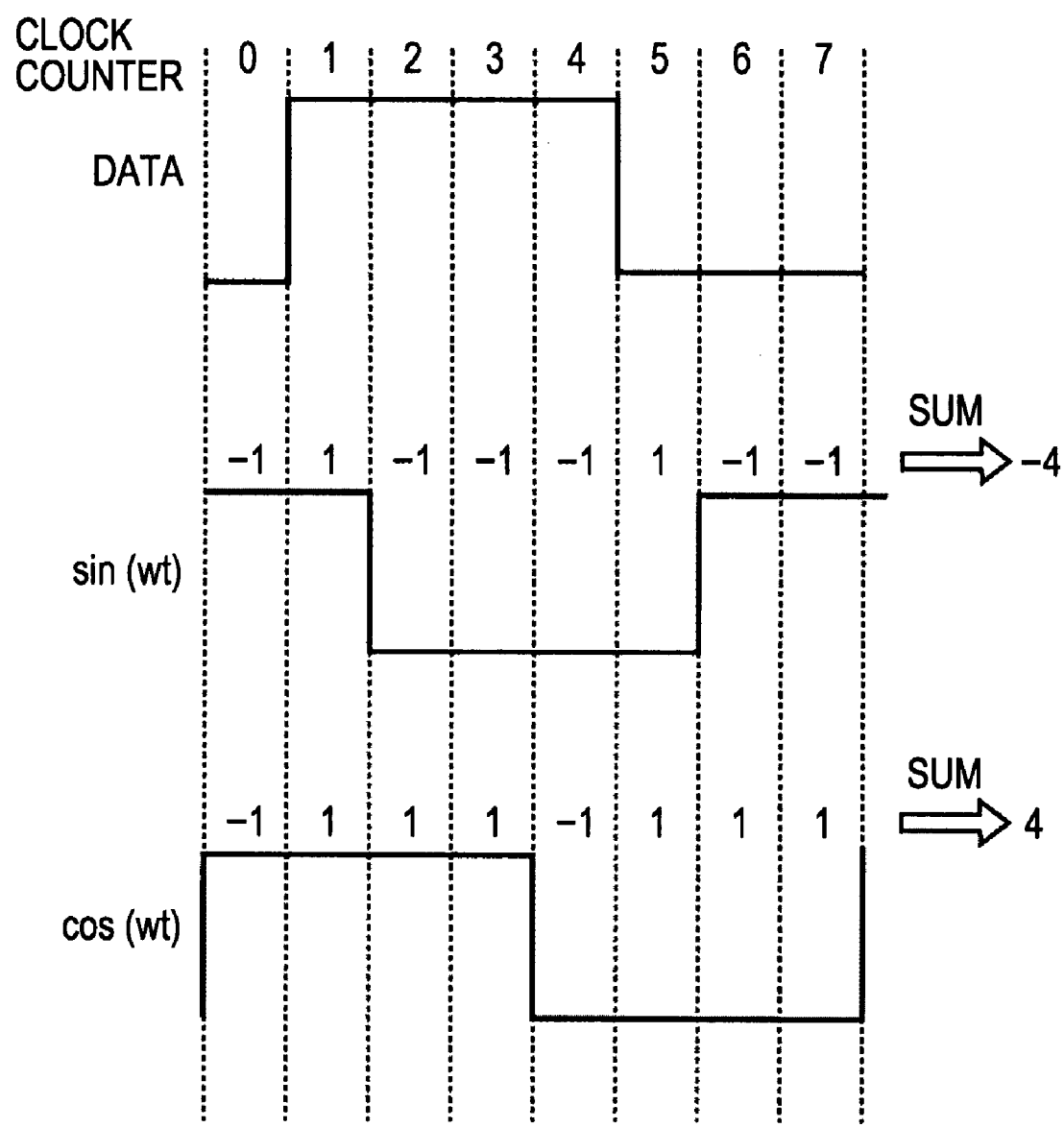
FIG. 14 is a diagram for illustrating a second pattern for timing of signal DATA to be input as to the signals sin(wt) and cos(wt)

The second pattern shown in FIG. 14 is a pattern wherein signal DATA is input in the digital PLL 112 with the phase being delayed 3Π/4 from the signal sin(wt), and the phase being delayed Π/4 from the signal cos(wt). With the second pattern, the value Σ{DATA×sin(wt)} becomes −4, and the value Σ{DATA×cos(wt)} becomes 4. Also, in the event that signal DATA is input with the timing shown in the second pattern, the value of Φn converges to 12 or 28, according to the initial value of Φn at the time of the input of signal DATA being started.

Figure 15:
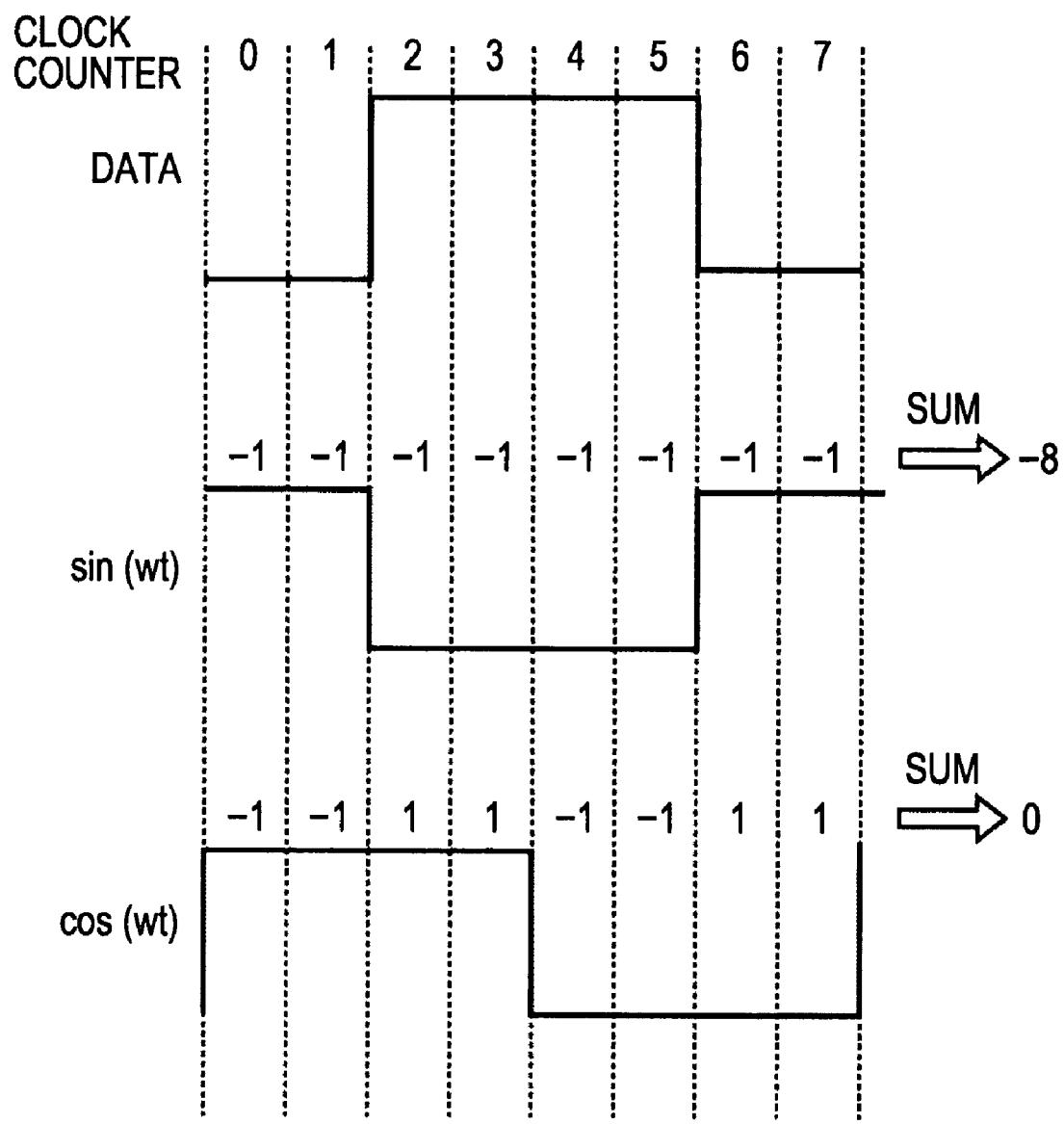
FIG. 15 is a diagram for illustrating a third pattern for timing of signal DATA to be input as to the signals sin(wt) and cos(wt)

The third pattern shown in FIG. 15 is a pattern wherein signal DATA is input in the digital PLL 112 with the phase being delayed Π from the signal sin(wt), and the phase being delayed Π/2 from the signal cos(wt). With the third pattern, the value Σ{DATA×sin(wt)} becomes −8, and the value Σ{DATA×cos(wt)} becomes 0. Also, in the event that signal DATA is input with the timing shown in the third pattern, the value of Φn converges to 0 or 16, according to the value of Φn at the time of the input of signal DATA being started.

Figure 16:
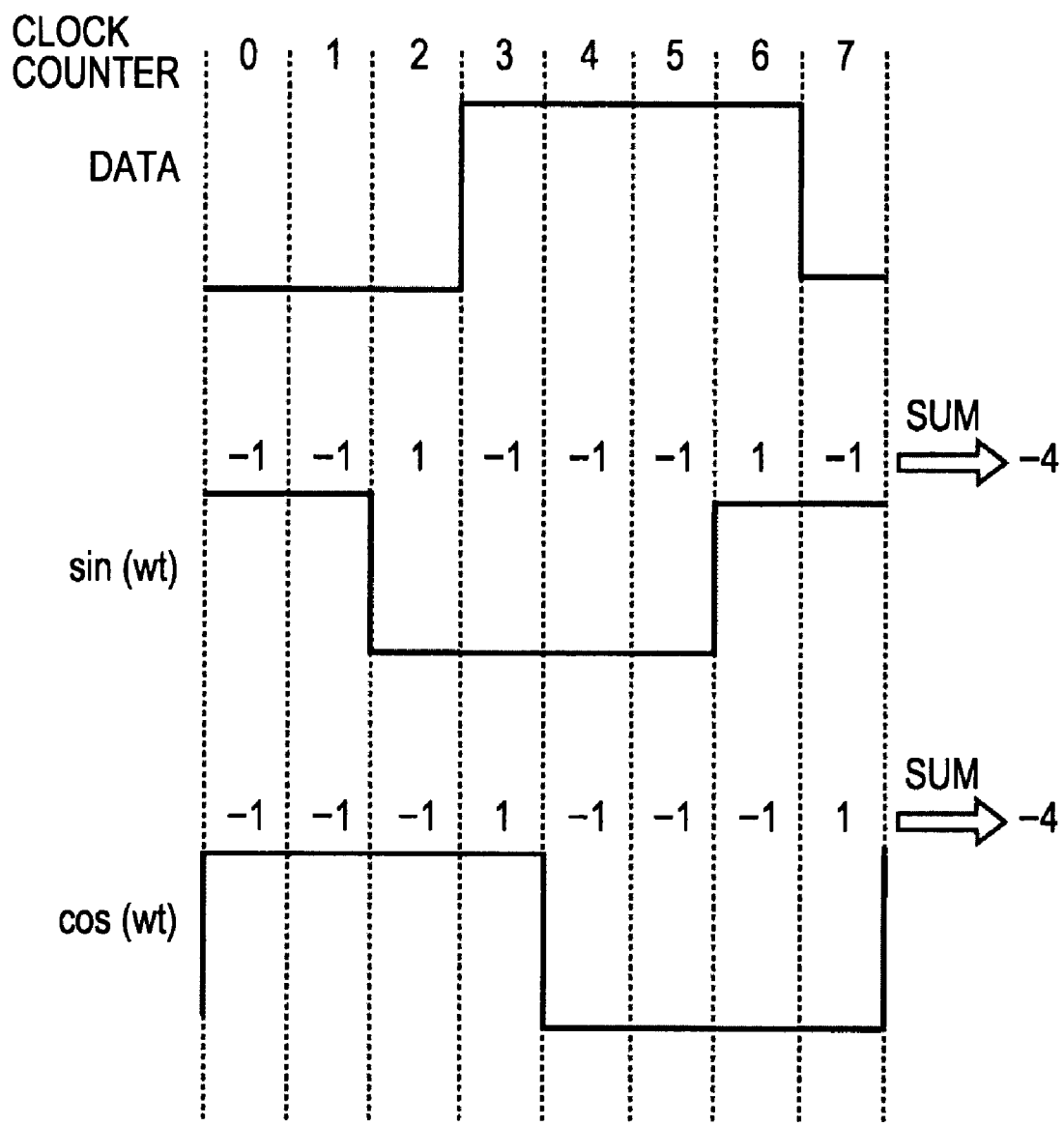
FIG. 16 is a diagram for illustrating a fourth pattern for timing of signal DATA to be input as to the signals sin(wt) and cos(wt)

The fourth pattern shown in FIG. 16 is a pattern wherein signal DATA is input in the digital PLL 112b with the phase being delayed 5Π/4 from the signal sin(wt), and the phase being delayed 3Π/4 from the signal cos(wt). With the fourth pattern, the value Σ{DATA×sin(wt)} becomes −4, and the value Σ{DATA×cos(wt)} becomes 4. Also, in the event that signal DATA is input with the timing shown in the fourth pattern, the value of Φn converges to 4 or 20, according to the value of Φn at the time of the input of signal DATA being started.

Figure 17:
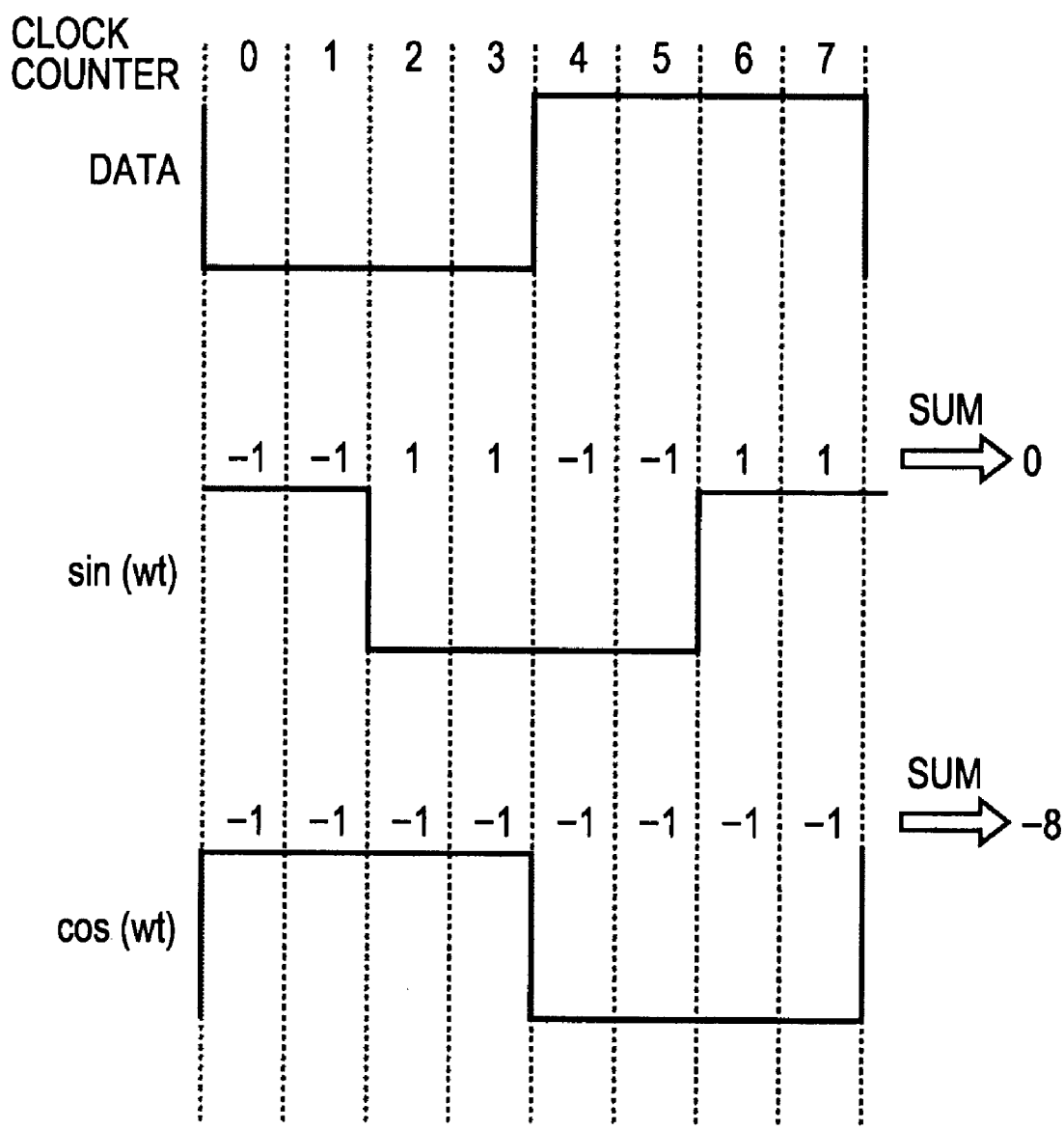
FIG. 17 is a diagram for illustrating a fifth pattern for timing of signal DATA to be input as to the signals sin(wt) and cos(wt)

The fifth pattern shown in FIG. 17 is a pattern wherein signal DATA is input in the digital PLL 112 with the phase being delayed 3Π/2 from the signal sin(wt), and the phase being delayed Π from the signal cos(wt). With the fifth pattern, the value Σ{DATA×sin(wt)} becomes 0, and the value Σ{DATA×cos(wt)} becomes 8. Also, in the event that signal DATA is input with the timing shown in the fifth pattern, the value of Φn converges to 8 or 24, according to the value of Φn at the time of the input of signal DATA being started.

Figure 18:
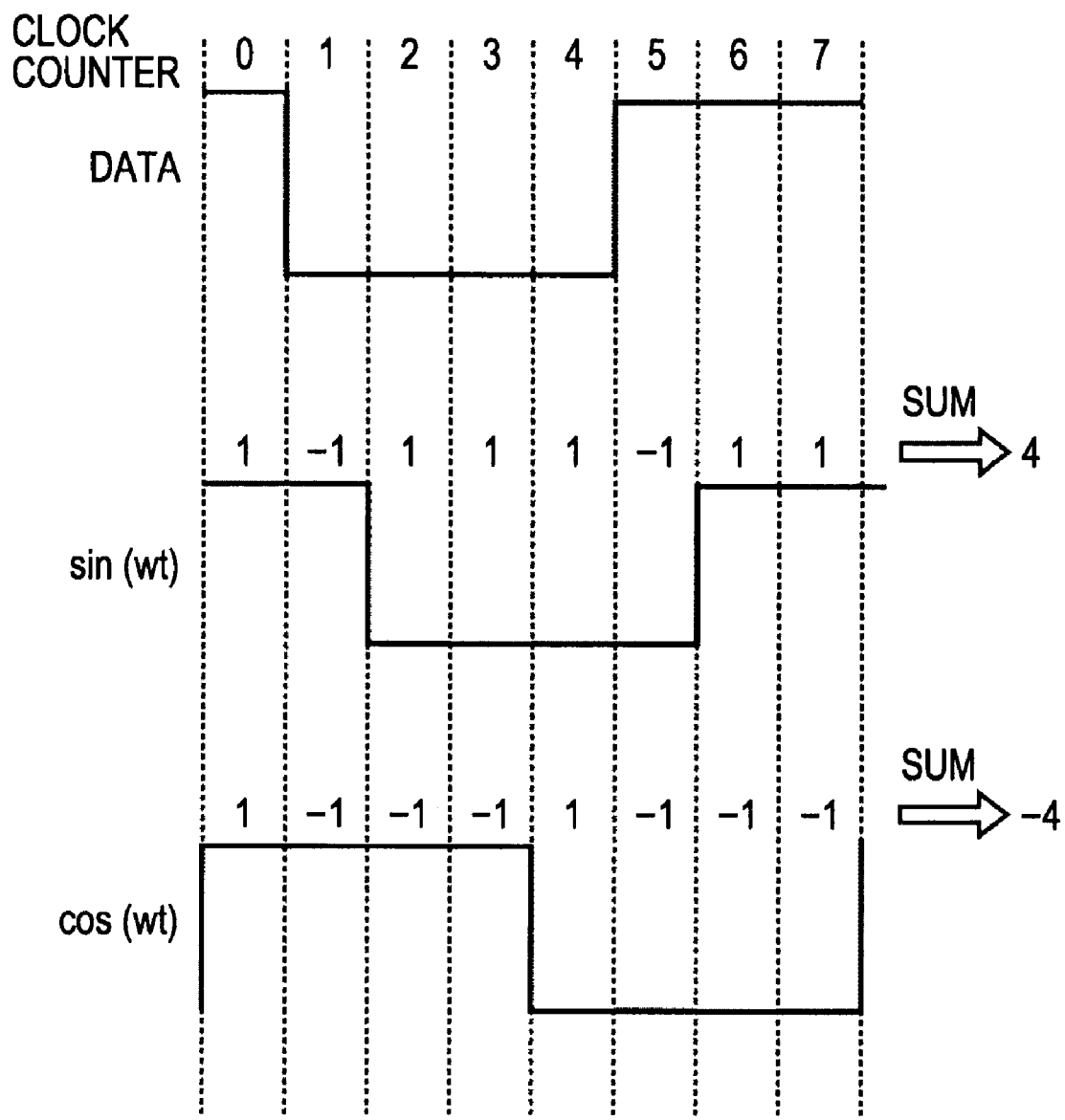
FIG. 18 is a diagram for illustrating a sixth pattern for timing of signal DATA to be input as to the signals sin(wt) and cos(wt)

The sixth pattern shown in FIG. 18 is a pattern wherein signal DATA is input in the digital PLL 112 with the phase being delayed 7Π/4 from the signal sin(wt), and the phase being delayed 5Π/4 from the signal cos(wt). With the sixth pattern, the value Σ(DATA×sin(wt)} becomes 4, and the value Σ{DATA×cos(wt)} becomes −4. Also, in the event that signal DATA is input with the timing shown in the sixth pattern, the value of Φn converges to 12 or 28, according to the value of Φn at the time of the input of signal DATA being started.

Figure 19:
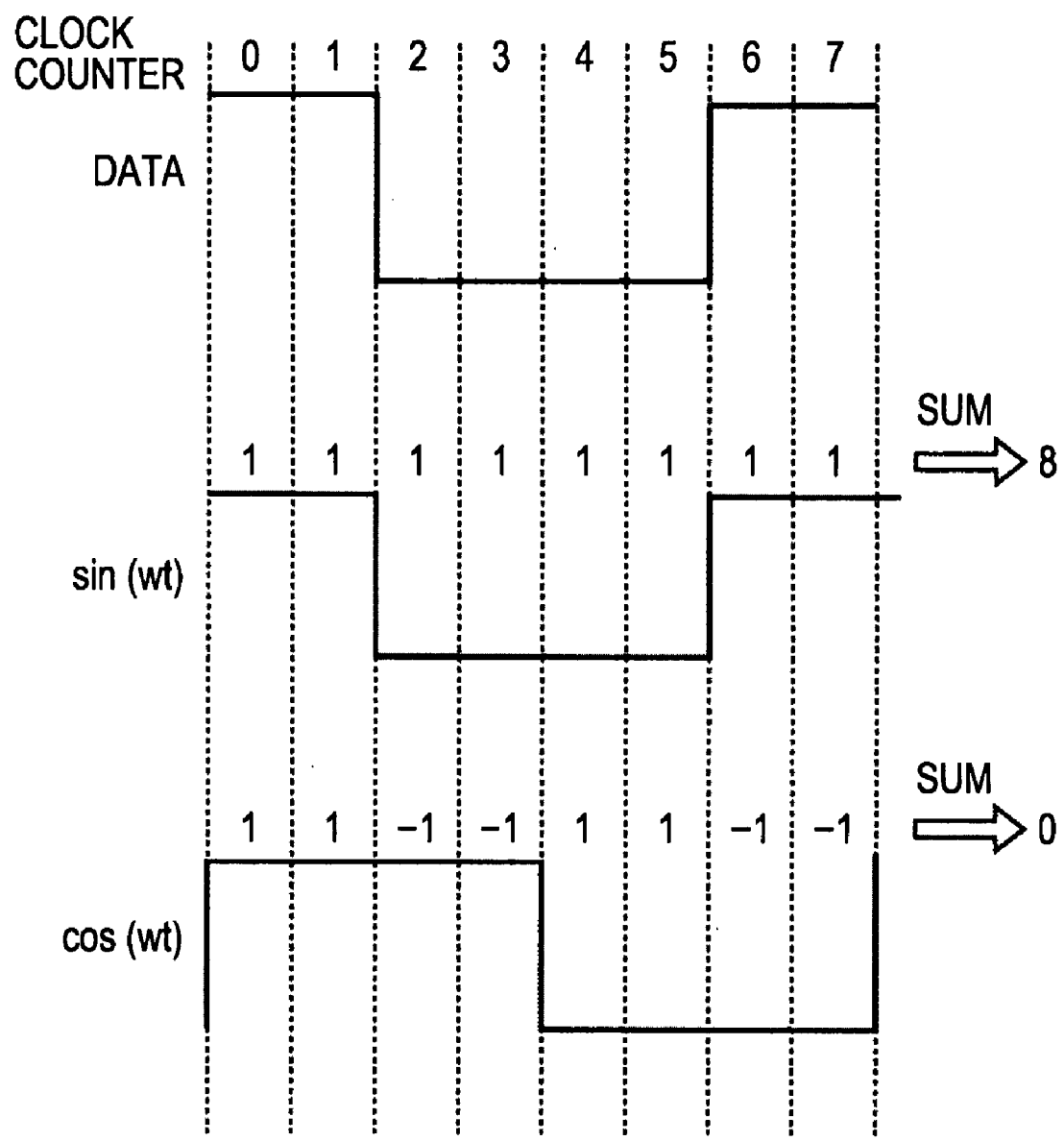
FIG. 19 is a diagram for illustrating a seventh pattern for timing of signal DATA to be input as to the signals sin(wt) and cos(wt)

The seventh pattern shown in FIG. 19 is a pattern wherein signal DATA is input in the digital PLL 112 with the phase being the same as the signal sin(wt), and the phase being delayed 3Π/2 from the signal cos(wt). With the seventh pattern, the value Σ{DATA×sin(wt)} becomes 8, and the value Σ{DATA×cos(wt)} becomes 0. Also, in the event that signal DATA is input with the timing shown in the seventh pattern, the value of Φn converges to 0 or 16, according to the value of Φn at the time of the input of signal DATA being started.

Figure 20:
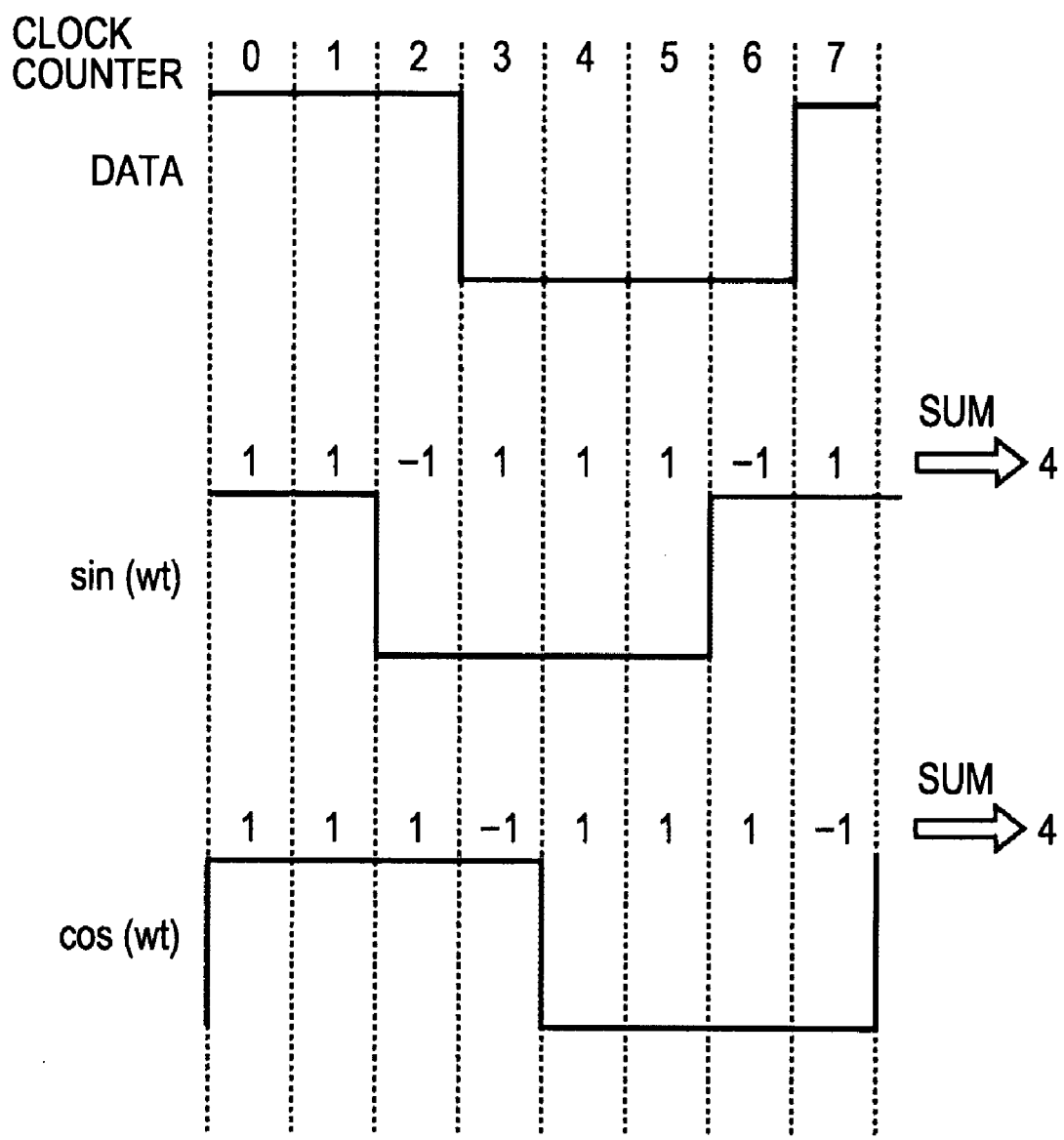
FIG. 20 is a diagram for illustrating a eighth pattern for timing of signal DATA to be input as to the signals sin(wt) and cos(wt)

The eighth pattern shown in FIG. 20 is a pattern wherein signal DATA is input in the digital PLL 112 with the phase being delayed Π/4 from the signal sin(wt), and the phase being delayed 7Π/4 from the signal cos(wt). With the eighth pattern, the value Σ{DATA×sin(wt)} becomes 4, and the value Σ(DATA×cos(wt)} becomes 4. Also, in the event that signal DATA is input with the timing shown in the eighth pattern, the value of Φn converges to 4 or 20, according to the value of Φn at the time of the input of signal DATA being started.

Another embodiment of the digital PLL 112 will be described below. Normally, with the signal DATA, a preamble of a predetermined pattern is attached before the valid data. The digital PLL 112 performs the processing described above during the period of the preamble, and locks the virtual control angle Φ. After locking, it is desirable for phase control by the digital PLL 112, i.e. control of the virtual control angle Φ, to be suppressed to the least necessary amount. However, with the above-described processing, a situation can be imagined wherein phase control is performed unnecessarily in the event that the duty ratio of the signal DATA is changed from 50%.

Figure 21:
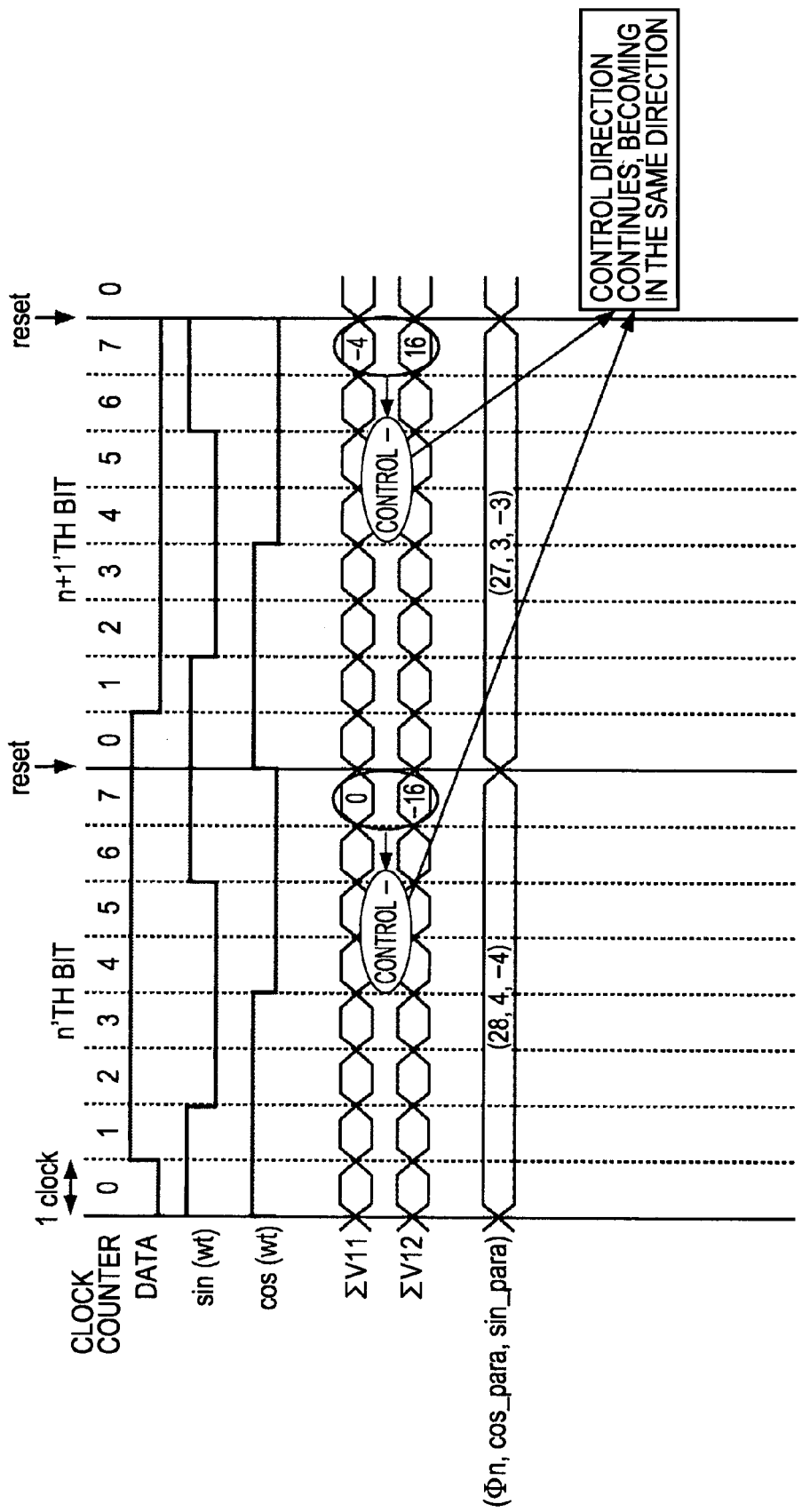
FIG. 21 is a diagram illustrating an example of the operation of the digital PLL in FIGS. 5 and 6.

For example, upon the value of Φn converging to 28, and the virtual control angle Φ being locked to Φ=28×ΔΦ, a situation can be considered wherein the duty ratio varies greatly from 50% with the n'th bit and the n+1'th bit of the signal DATA, as shown in FIG. 21.

In this case, at the n'th bit of the signal DATA, the value ΣV11 becomes 0, the value ΣV12 becomes −16, the control direction is set in the − direction, and the value of Φn is decremented from 28 to 27. Also, at the n+1'th bit of the signal DATA, the value ΣV11 becomes −4, the value ΣV12 becomes 16, the control direction is set in the − direction, and the value of Φn is decremented from 27 to 26. That is to say, once the virtual control angle Φ is locked, the control direction is continuously set in the same direction with the changes of the duty ratio, the virtual control angle Φ is separated from the locked value whereby a situation is created wherein the data before modulation is possibly not being able to accurately be restored from the signal DATA.

In order to prevent this phenomenon, for example, an arrangement may be made wherein the control direction is obtained every one-half cycle of signal DATA, and a final control direction is determined based on the two obtained control directions every 1 cycle of signal DATA. Now, the processing of the digital PLL 112b in the event of using this technique will be described with reference to FIG. 21.

In the case of using this technique, the LPF 161a-1 cumulatively adds the values cos_para×DATA×sin(wt), and supplies a signal $\Sigma\{\cos\_para \times DATA \times \sin(wt)\}$ indicating the value $\Sigma\{\cos\_para \times DATA \times \sin(wt)\}$ wherein the values cos_para×DATA×sin(wt) have been, cumulatively added over a period of four clocks worth of the clock signal f_clk, i.e., over a one-half cycle of signal DATA, to the adder 162*a*. Upon supplying the signal $\Sigma\{\cos\_para \times DATA \times \sin(wt)\}$, the value held by the LPF 161*a*-1 is reset, the LPF 161*a*-1 cumulatively adds the values cos_para×DATA×sin(wt) again from 0. That is to say, the LPF 161*a*-1 cumulatively adds the values cos_para×DATA×sin(wt) of a half-cycle worth for every one-half cycle of signal DATA and supplies the signal $\Sigma\{\cos\_para \times DATA \times \sin(wt)\}$ indicating the value $\Sigma\{\cos\_para \times DATA \times \sin(wt)\}$ which has been cumulatively added to the adder 162*a*.

Similarly, the LPF 161*a*-2 cumulatively adds the values sin_para×DATA×cos(wt) of a half-cycle worth for every one-half cycle of signal DATA and supplies the signal $\Sigma\{\sin\_para \times DATA \times \cos(wt)\}$ indicating the value $\Sigma\{\sin\_para \times DATA \times \cos(wt)\}$ which has been cumulatively added to the adder 162*a*. Also, the LPF 161*b*-1 cumulatively adds the values sin_para×DATA×sin(wt) of a half-cycle worth for every one-half cycle of signal DATA and supplies the signal $\Sigma\{\sin\_para \times DATA \times \sin(wt)\}$ indicating the value $\Sigma\{\sin\_para \times DATA \times \sin(wt)\}$ which has been cumulatively added, to the adder 162*b*. Further, the LPF 161*b*-2 cumulatively adds the values cos_para×DATA×cos(wt) of a half-cycle worth for every one-half cycle of signal DATA and supplies the signal $\Sigma\{\sin\_cos \times DATA \times \cos(wt)\}$ indicating the value $\Sigma\{\cos\_para \times DATA \times \cos(wt)\}$ which has been cumulatively, added to the adder 162*b*.

The adder 162*a* adds the values $\Sigma\{\cos\_para \times DATA \times \sin(wt)\}$ and the values $\Sigma\{\sin\_para \times DATA \times \cos(wt)\}$ for every one-half cycle of the signal DATA, generates a signal $\Sigma V11$ indicating an added value V11 (=$\Sigma\{\cos\_para \times DATA \times \sin(wt)+\sin\_para \times DATA \times \cos(wt)\}$, and supplies this to the ACT 136.

The adder 162*b* adds the values wherein the sign of the value $\Sigma\{\sin\_para \times DATA \times \sin(wt)\}$ is inverted, and the values $\Sigma\{\cos\_para \times DATA \times \cos(wt)\}$ for every one-half cycle of the signal DATA, generates a signal $\Sigma V12$ indicating an added value V12 (=$\Sigma\{\sin\_para \times DATA \times \sin(wt)+\cos\_para \times DATA \times \cos(wt)\}$, and supplies this to the ACT 136.

The control direction setting unit 181 obtains the control direction based on the signs of the value $\Sigma V11$ and the value $\Sigma V12$ for every one-half cycle of the signal DATA using the chart shown in FIG. 8 as described above, takes the majority of the obtained control directions for every cycle of the signal DATA, and determines the control direction based on the results of the majority decision. More specifically, the control direction setting unit 181 obtains the control direction in the period wherein the clock counter is at 0 through 3 (hereafter, also called the first half) and the control direction in the period wherein the clock counter is at 4 through 7 (hereafter, also called the latter half), and with the two obtained control directions, determines the control direction to be the + direction in the event there is a majority of the + direction, and determines the control direction to be the − direction in the event there is a majority of the − direction, and determines the control direction to be 0 in the event there are the same number of + directions and − directions. The control direction setting unit 181 notifies the determined control direction to the virtual control angle control unit 182. The other portions of the digital PLL 112*b* perform the same processing as the above-described processing.

Figure 22:
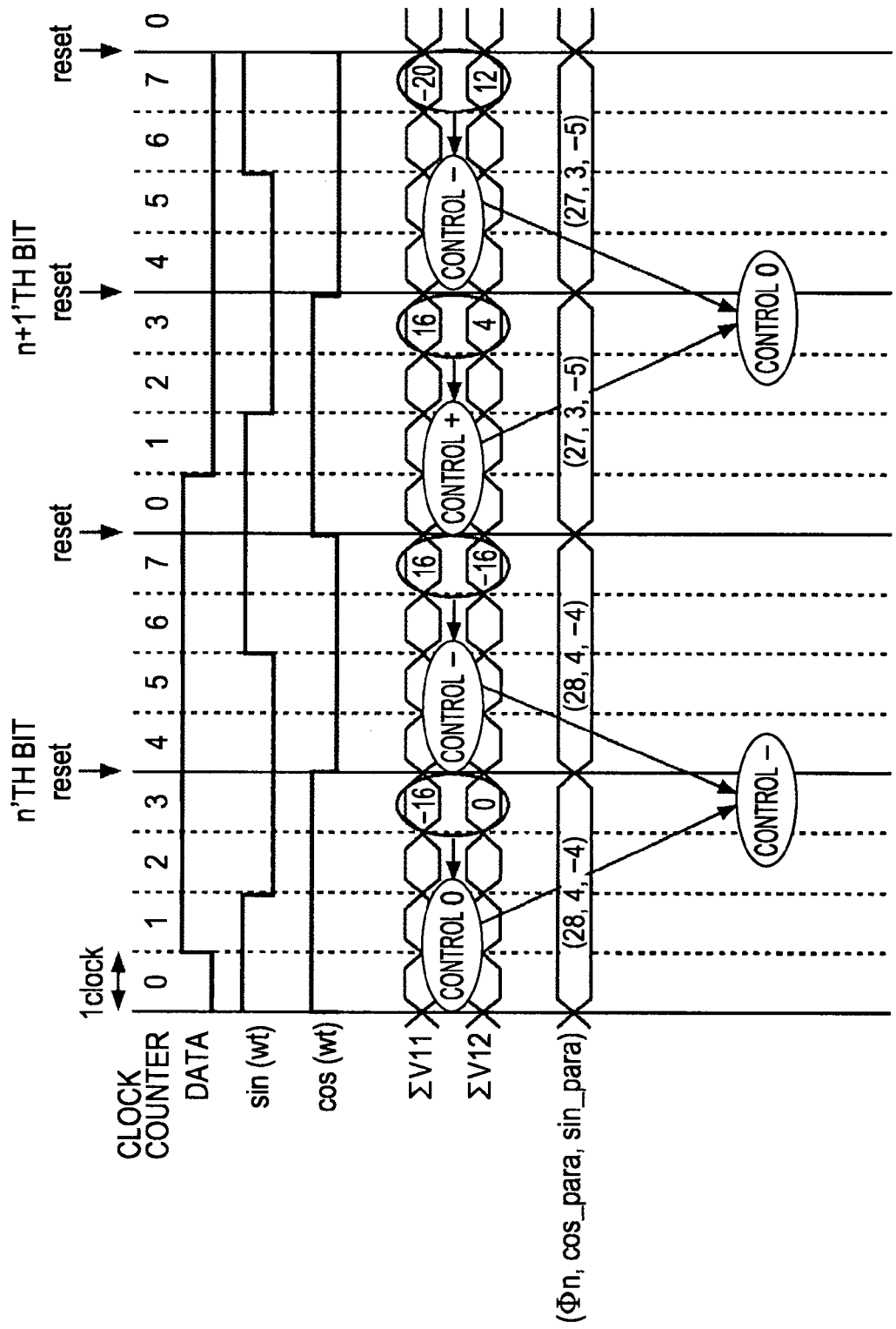
FIG. 22 is a diagram illustrating an improvement example of the operation of the digital PLL in FIGS. 5 and 6.

For example, as shown in FIG. 22, in the event that the signal DATA is input with the same conditions as in FIG. 21, at the first half of the n'th bit of signal DATA, the value $\Sigma V11$ becomes −16 and the value $\Sigma V12$ becomes 0. Accordingly, based on the chart shown in FIG. 8, the control direction for the first half of the n'th bit of the signal DATA becomes 0. Also, for the latter half of the n'th bit of signal DATA, the value $\Sigma V11$ becomes 16, and the value $\Sigma V12$ becomes −16. Accordingly, based on the chart shown in FIG. 8, the control direction for the latter half of the n'th bit of signal DATA has a control direction in the − direction.

Accordingly, with the n'th bit of signal DATA, the control direction of the first half becomes 0 and the control direction of the latter half is in the − direction, so since there are more of the − direction than the + direction, the control direction is finally determined to be in the − direction. Thus, the value of $\Phi n$ is decremented from 28 to 27, and the value of cos_para is controlled to be 3, and the value of sin_para is controlled to be −5.

Also, the value $\Sigma V11$ becomes 16 and the value $\Sigma V12$ becomes 4 at the first half of the n+1'th bit of the next signal DATA. Accordingly, the control direction of the first half of the n+1'th bit of signal DATA is in the + direction, based on the chart shown in FIG. 8. Also, the value $\Sigma V11$ becomes −20 and the value $\Sigma V12$ becomes 12 in the latter half of the n+1'th bit of signal DATA. Accordingly, the control direction of the latter half of the n+1'th bit of signal DATA has a control direction in the − direction, based on the chart shown in FIG. 8.

Accordingly, for the n+1'th bit of signal DATA, the control direction of the front half is in the + direction, and the latter half is in the − direction, so there are equal counts of the + direction and the − direction, whereby the control direction is finally determined to be 0. Thus, the values of $\Phi n$, cos_para, and sin_para are not changed.

Thus, control of the virtual control angle $\Phi$ can be prevented from being performed more than necessary.

However, in the event that an arrangement is made whereby the control direction is determined by majority rule of the control direction for every one-half cycle, for example, a situation may occur wherein the phases of the signal DATA and the virtual signal sin(wt+$\Phi$) are not identical in the preamble portion of the signal DATA, and yet; control of $\Phi n$, i.e. control of the virtual control angle $\Phi$ is not performed.

Figure 23:
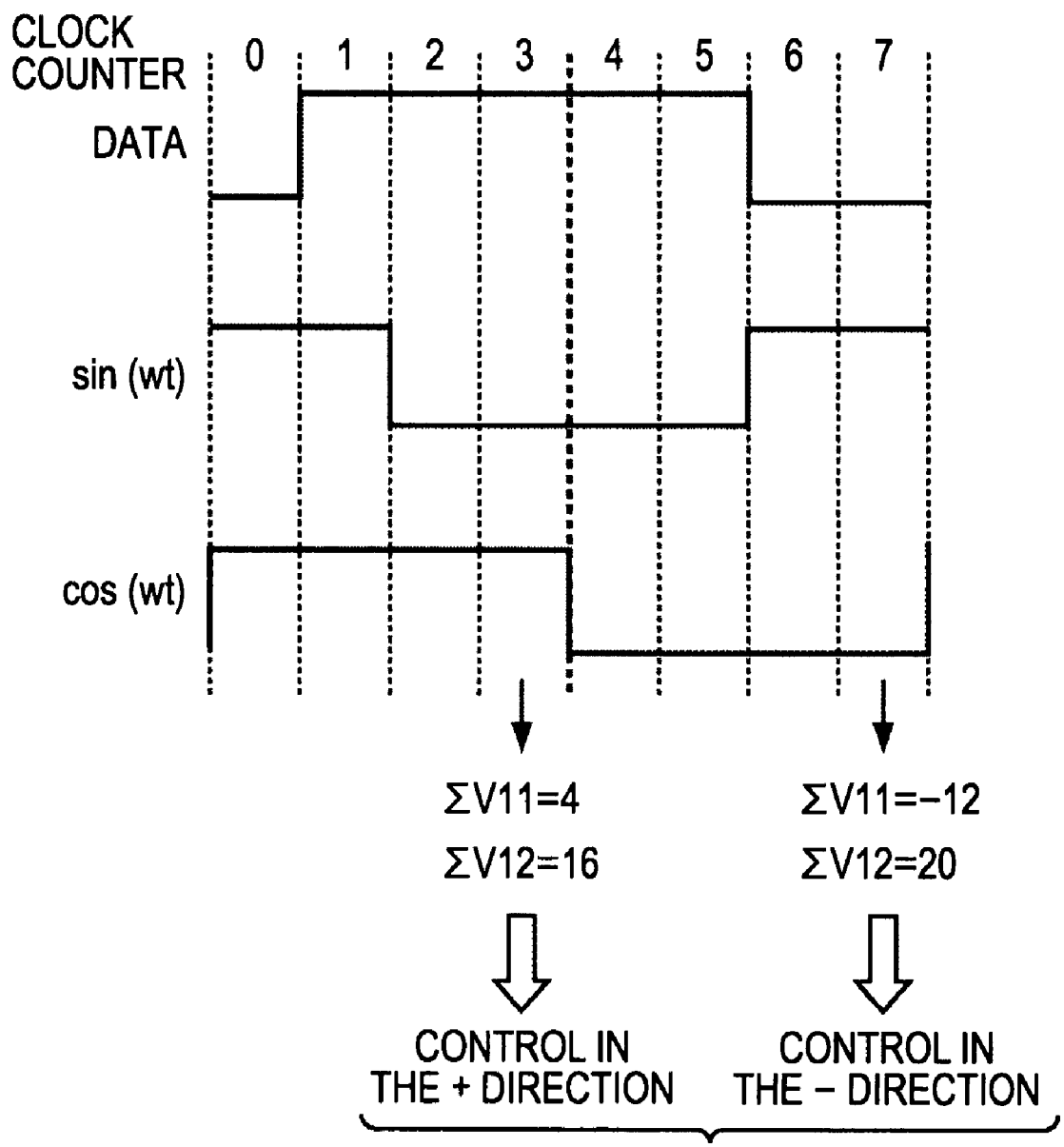
FIG. 23 is a diagram illustrating an example of the operation of the digital PLL in FIGS. 5 and 6.

For example, in the case of $\Phi n=5$, in the event that the n'th bit of signal DATA shown in FIG. 23 is input in the digital PLL 112*b*, the value of $\Sigma V11$ becomes 4 and the value of $\Sigma V12$ becomes 16 at the first half of the n'th bit of signal DATA, and the value of $\Sigma V11$ becomes −12 and the value of $\Sigma V12$ becomes −20 at the latter half of the n'th bit of signal DATA. As a result, at the n'th bit of signal DATA, the control direction of the first half is in the + direction and the control direction of the latter half is in the − direction, thus there are equal counts of the − direction and + direction, so control of $\Phi n$ is not performed, regardless of the phases of the signal DATA and the virtual signal sin(wt+$\phi$) not being identical.

In order to prevent such a phenomenon, an arrangement may be made wherein the control direction is forcibly determined to be in the + direction or the − direction, for example, in the event that the control directions of the first half and the latter half are in the, opposite direction.

Now, in the event that the LPF 161*a*-1 through LPF 161*b*-2 are configured employing flip-flopping, when the internal register holding the cumulatively added value is reset, the value of the internal register becomes 0 at the next clock counter which has been reset, and a situation may occur wherein an accurate cumulatively added value is not obtained.

Figure 24:
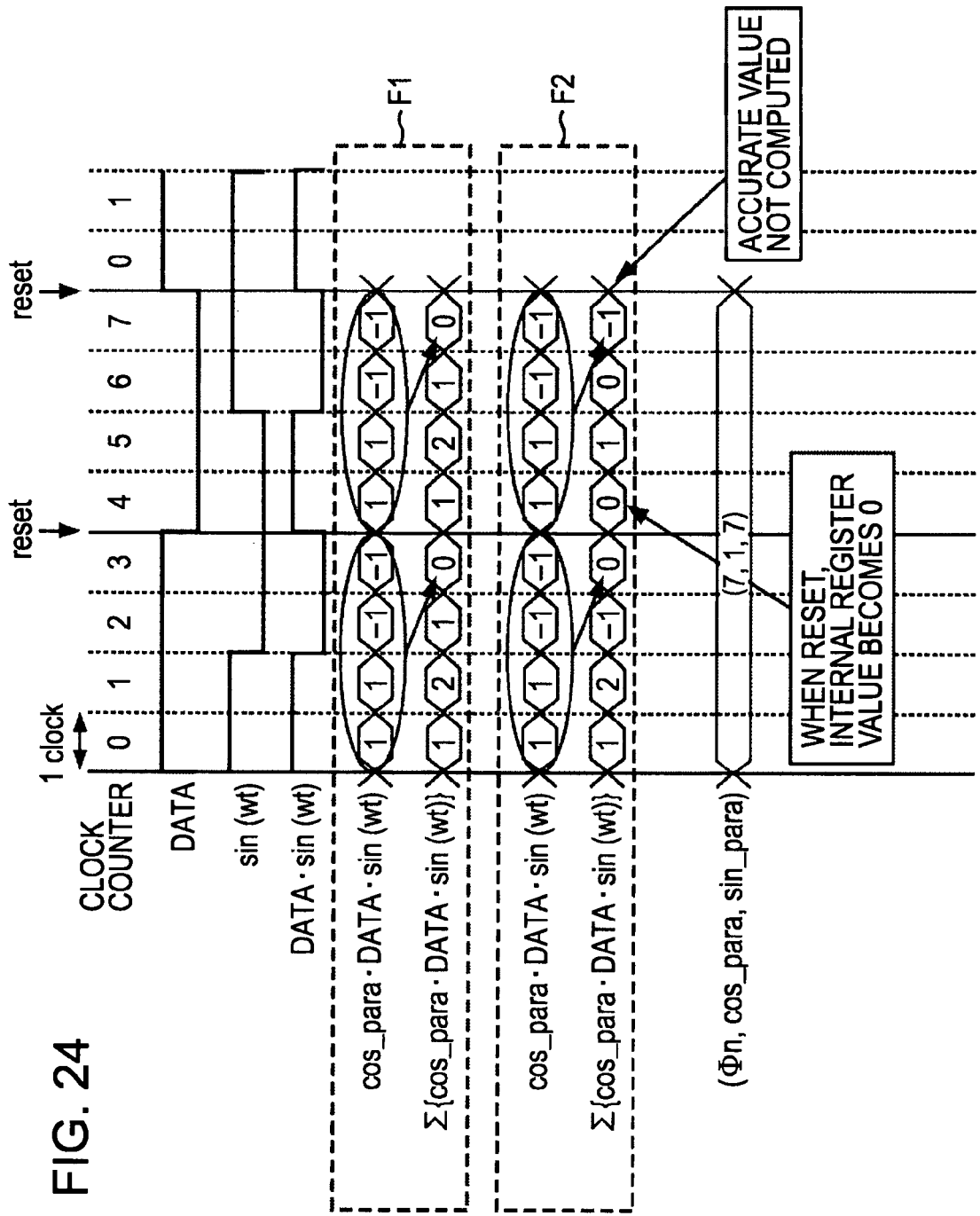
FIG. 24 is a diagram illustrating an example of the operation of the digital PLL in FIGS. 5 and 6.

For example, in the event that the LPF 161*a*-1 cumulatively adds the values cos_para×DATA×sin(wt) for every one-half cycle of signal DATA, when the value cos_para×DATA×sin(wt) changes as 1, 1, −1, −1, 1, 1, −1, −1 during 0 through 7 of the clock counter, as shown in FIG. 24, the value Σ{cos_para×DATA×sin(wt)} of the internal register of the LPF 161a-1 must becomes 0 when the clock counter is at 3, and 0 when the clock counter is at 7, as shown within the frame F1 in the diagram. However, as shown in the frame F2 in the diagram, in the event that the internal register of the LPF 161a-1 is reset when the clock counter is at 3, the value Σ{cos_para×DATA×sin(wt)} of the internal register of the LPF 161a-1 becomes 0 when the clock counter is at 4, and the value Σ{ cos_para×DATA×sin(wt)} becomes −1 when the clock counter is at 7, whereby there is a situation of inaccurate values.

FIG. 25 is a circuit diagram illustrating an embodiment of the digital PLL 112 configured to prevent such a phenomenon. Note that in order to distinguish between the above-described digital PLL 112a and digital PLL 112b, the digital PLL 112 in FIG. 25 will be called the digital PLL 112c.

The digital PLL 112c in FIG. 25 is made up of a frequency divider 131, Exor circuits 132a and 132b, multipliers 133a-1 through 133b-2, ACT 136, adders 162a and 162b, LPFs 311a-1 through 311b-4, and switches 312a-1 through 312b-4. Note that the portions corresponding to FIG. 6 have the same reference numerals, in the drawing have been denoted with the same reference numerals, and redundant description of the portions with similar processing will be omitted. LPF 311a-1 cumulatively adds the values cos_para×DATA×sin(wt) when the value of the clock counter is at 0 through 3, and supplies a signal Σ{ cos_para×DATA×sin(wt)} indicating the cumulatively added value Σ{ cos_para×DATA×sin(wt)} to the adder 162a, via the switch 312a-1. The LPF 311a-1 resets the cumulatively added value held in an unshown internal register at the point of the clock counter having turned to 4, and maintains the internal register value of 0 when the value of the clock counter is at 4 through 7. That is to say, the LPF 311a-1 cumulatively adds the values cos_para×DATA×sin(wt) over the one-half cycle of signal DATA every other time, and supplies the signal Σ{ cos_para×DATA×sin(wt)} indicating the cumulatively added value Σ{ cos_para×DATA×sin(wt)} to the adder 162a.

Similarly, the LPF 311a-2 cumulatively adds the values sin_para×DATA×cos(wt) when the value of the clock counter is at 0 through 3, supplies the signal Σ{ sin_para×DATA×cos(wt)} indicating the cumulatively added value Σ{ sin_para×DATA×cos(wt)} to the adder 162a via the switch 312a-2, and maintains the internal register value of 0 when the clock counter value is at 4 through 7.

On the other hand, the LPF 311a-3 cumulatively adds the values cos_para×DATA×sin(wt) when the value of the clock counter is at 4 through 7, and supplies the signal Σ{ cos_para×DATA×sin(wt)} indicating the cumulatively added value Σ{ cos_para×DATA×sin(wt)} to the adder 162a, via the switch 312a-3. The LPF 311a-3 resets the added value held in an unshown internal register at the point of the clock counter having turned to 0, and maintains the internal register value at 0 when the clock counter value is at 0 through 3. That is to say, the LPF 311a-3 cumulatively adds the values cos_para×DATA×sin(wt) over the one-half cycle of signal DATA every other time, so as to alternate with the LPF 311a-1, and supplies the signal Σ{ cos_para×DATA×sin(wt)} indicating the cumulatively added value Σ{ cos_para×DATA×sin(wt)} to the adder 162a.

In the same way, the LPF 311a-4 cumulatively adds the values sin_para×DATA×cos(wt) when the clock counter value is at 4 through 7, supplies the signal Σ{ sin_para×DATA×cos(wt)} indicating the cumulatively added value Σ{ sin_para×DATA×cos(wt)} to the adder 162a via the switch 312a-4 and maintains the internal register value at 0 when the clock counter value is at 0 through 3.

Also, the LPF 311b-1 cumulatively adds the values sin_para×DATA×sin(wt) when the clock counter value is at 0 through 3, supplies the signal Σ{ sin_para×DATA×sin(wt)} indicating the cumulatively added value Σ{ sin_para×DATA×sin(wt)} to the adder 162b via the switch 312b-1 and maintains the internal register value at 0 when the clock counter value is at 4 through 7.

In the same way, the LPF 311b-2 cumulatively adds the values cos_para×DATA×cos(wt) when the clock counter value is at 0 through 3, supplies the signal Σ{ cos_para×DATA×cos(wt)} indicating the cumulatively added value Σ{ cos_para×DATA×cos(wt)} to the adder 162b via the switch 312b-2 and maintains the internal register value at 0 when the clock counter value is at 4 through 7.

Further, the LPF 311b-3 cumulatively adds the values sin_para×DATA×sin(wt) when the clock counter value is at 4 through 7, supplies the signal Σ{ sin_para×DATA×sin(wt)} indicating the cumulatively added value Σ{ sin_para×DATA×sin(wt)} to the adder 162b via the switch 312b-3 and maintains the internal register value at 0 when the clock counter value is at 0 through 3.

In the same way, the LPF 311b-4 cumulatively adds the values cos_para×DATA×cos(wt) when the clock counter value is at 4 through 7, supplies the signal Σ(cos_para×DATA×cos(wt)} indicating the cumulatively added value Σ{ cos_para×DATA×cos(wt)} to the adder 162b via the switch 312b-4 and maintains the internal register value at 0 when the clock counter value is at 0 through 3.

That is to say, the LPFs 311a-1, 311a-2, 311b-1, and 311b-2 compute a cumulative conversion value every one-half cycle with the same timing, and the LPFs 311a-3, 311a-4, 311b-3, and 311b-4 compute a cumulative conversion value every one-half cycle with the same timing, so as to alternate with the LPF 311a-1, 311a-2, 311b-1, and 311b-2.

The switches 312a-1, 312a-2, 312b-1, and 312b-2 are turned on when the clock counter is at 3, and are turned off during all other periods.

The switches 312a-3, 312a-4, 312b-3, and 312b-4 are turned on when the clock counter is at 7, and are turned off during all other periods.

The adder 162a adds the value of the signal Σ{ cos_para×DATA×sin(wt)} supplied from the LPF 311a-1 via the switch 312a-1 and the value of the signal Σ{ sin_para×DATA×cos(wt)} supplied from the LPF 311a-2 via the switch 312a-2, when the clock counter is at 3, and supplies the signal ΣV11 indicating the added value ΣV11 to the control direction setting unit 181. Also, the adder 162a adds the value of the signal Σ{ cos_para×DATA×sin(wt)} supplied from the LPF 311a-3 via the switch 312a-3 and the value of the signal Σ{ sin_para×DATA×cos(wt)} supplied from the LPF 311a-4 via the switch 312a-4, when the clock counter is at 7, and supplies the signal ΣV11 indicating the added value Evil to the control direction setting unit 181.

The adder 162b adds the value wherein the sign of the value of the signal Σ{ sin_para×DATA×sin(wt)} supplied from the LPF 311b-1 via the switch 312b-1 is inverted and the value of the signal Σ{ cos_para×DATA×cos(wt)} supplied from the LPF 311b-2 via the switch 312b-2, when the clock counter is at 3, and supplies the signal ΣV12 indicating the added value ΣV12 to the control direction setting unit 181. Also, the adder 162b adds the value wherein the sign of the value of the signal Σ{ sin_para×DATA×sin(wt)} supplied from the LPF 311b-3 via the switch 312b-3 is inverted and the value of the signal Σ{ cos_para×DATA×cos(wt)} supplied from the LPF 311b-4 via the switch 312b-4, when the clock counter is at 7, and supplies the signal ΣV12 indicating the added value ΣV12 to the control direction setting unit 181.

Figure 26:
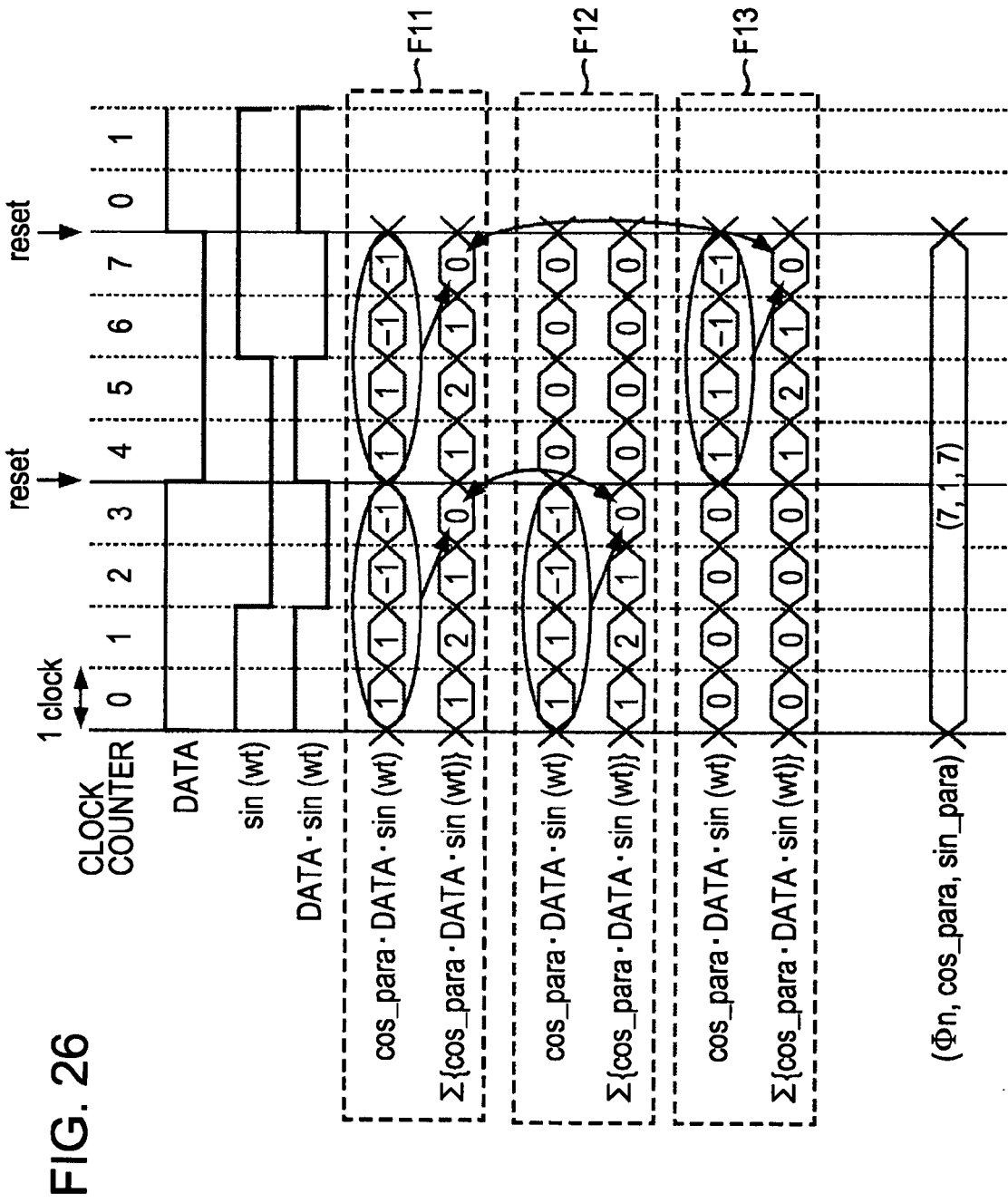
FIG. 26 is a diagram for describing the operation of the digital PLL in FIG. 25.

Now, the processing of the digital PLL 112c in the event that signal DATA is input with the same conditions as in FIG. 24 will be described with reference to FIG. 26. Note that the portions enclosed with the frame F11 in the diagram are the same portions enclosed with the frame F1 in FIG. 24, and indicates the correct values of the value cos_para×DATA×sin(wt) and the value Σ{ cos_para×DATA×sin(wt)}.

As shown in the portions surrounded by the frame F12 in the diagram, the LPF 311a-1 cumulatively adds the values cos_para×DATA×sin(wt) supplied from the multiplier 133a-1 during the period that the clock counter is at 0 through 3, and when the clock counter is at 3, the internal register value Σ{ cos_para×DATA×sin(wt)} becomes 0. When the clock counter is at 3, the switch 312a-1 is turned on, and the LPF 311a-1 supplies the signal Σ{ sin_para×DATA×cos(wt)} indicating the internal register value to the adder 162a, via the switch 312a-1. After this, the LPF 311a-1 resets the internal register value, and maintains the internal register value at 0 during the period of the clock counter being at 4 through 7, and cumulatively adds the values cos_para×DATA×sin(wt) supplied from the multiplier 133a-1 again during the period of the clock counter being at 0 through 3.

On the other hands, as shown in the portions surrounded by the frame F13 in the diagram, the LPF 311a-3 maintains the internal register value at 0 during the period that the clock counter is at 0 through 3, and when the clock counter is at 4 through 7, the LPF 311a-3 cumulatively adds the value cos_para×DATA×sin(wt) supplied from the multiplier 133a-1, and when the clock counter is at 7, the internal register value Σ{ cos_para×DATA×sin(wt)} becomes 0. When the clock counter is at 7, the switch 312a-2 is turned on, and the LPF 311a-3 supplies the signal Σ{ sin_para×DATA×cos(wt)} indicating the internal register value to the adder 162a, via the switch 312a-3. After this, the LPF 311a-3 resets the internal register value, and maintains the internal register value at 0 during the period of the clock counter being at 0 through 3, and cumulatively adds the values cos_para×DATA×sin(wt) supplied from the multiplier 133a-1 again during the period of the clock counter being at 4 through 7.

Thus, the value Σ{ sin_para×DATA×cos(wt)} supplied to the adder 162a becomes equal to the accurate value shown in the framed area F11.

Note that similar operations are performed for the other LPFs and switches, so accurate cumulatively added values are supplied to the adders 162a and 162b.

Figure 27:
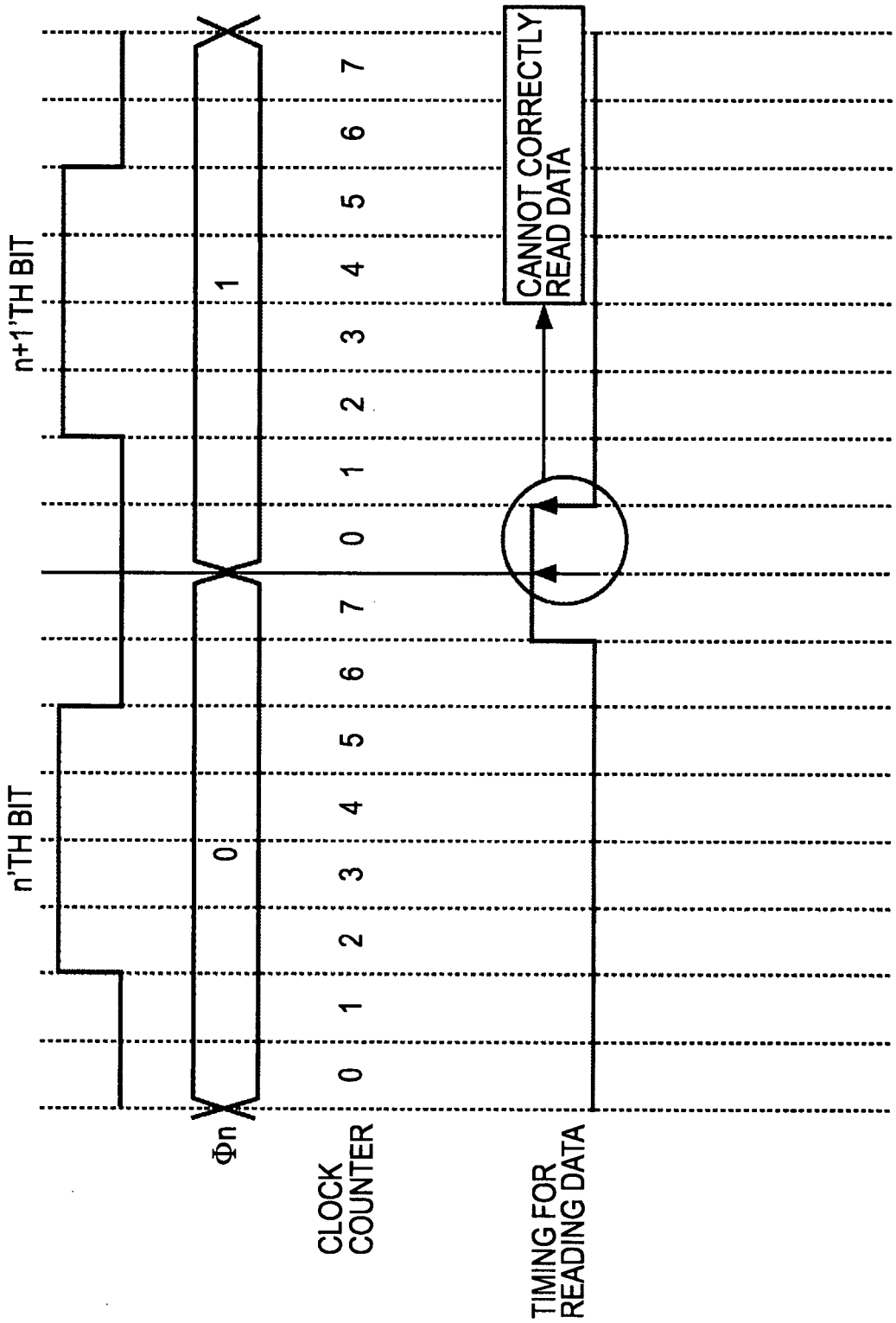
FIG. 27 is a diagram illustrating an example of the operation of the digital PLL in FIGS. 5 and 6.

Also, with the above-described processing, in the event that the value of Φn is changed from 0 to 1 going from the n'th bit to the n+1'th bit of signal DATA, for example, as shown in FIG. 27, upon the data from the signal DATA being read when the clock counter at the n'th bit is at 7, the data is continuously read from the signal DATA when the clock counter at the n+1'th bit is at 0, and consequently the same data is read at the n'th bit and the n+1'th bit of the signal DATA, thereby causing a situation wherein the original bit row cannot be correctly extracted.

FIG. 28 is a circuit diagram showing a configuration example of the digital PLL 112 arranged so as to prevent such a phenomenon. Note that in order to distinguish between the above-described digital PLL 112a through digital PLL 112c, the digital PLL 112 in FIG. 28 will be called a digital PLL 112d.

The digital PLL 112d in FIG. 28 is made up of a frequency divider 131, Exor circuits 132a and 132b, multipliers 133a-1 through 133b-2, adders 162a and 162b, LPFs 311a-1 through 311b-4, switches 312a-1 through 312b-4, and an ACT 351. Note that the portions corresponding to FIG. 25 in the drawing have been denoted with the same reference numerals, and redundant description of the portions with similar processing will be omitted.

The ACT 351 controls the values of cos_para and sin_para, based on the signal ΣV11 supplied from the adder 162a and the signal ΣV12 supplied from the adder 162b. The ACT 351 supplies a signal indicating the value of the controlled cos_para to the multipliers 133a-1 and 133b-2, and supplies a signal indicating the value of the controlled sin_para to the multipliers 133a-2 and 133b-1. Also, the ACT 351 generates two lines of timing signals indicating the timing for reading data from the signal DATA, based on the signal ΣV11 and the signal ΣV12, and supplies these to the CPU 113.

Figures 29, 30:
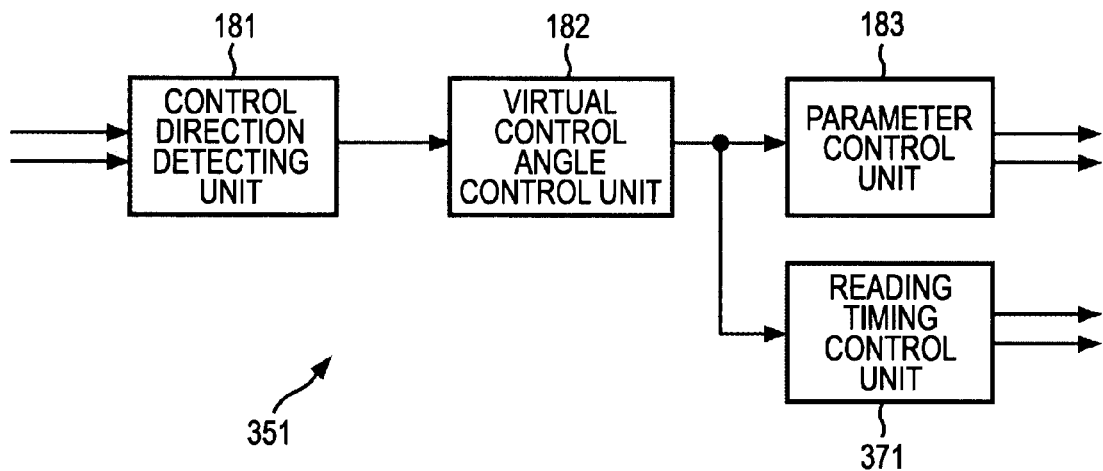
FIG. 29 is a block diagram illustrating a functional configuration of the ACT in FIG. 28.
FIG. 30 is a chart illustrating an example of timing for reading out data.

FIG. 29 is a block diagram illustrating the functional configuration of the ACT 351 in FIG. 28. The ACT 351 is configured so as to include a control direction setting unit 181, virtual control angle control unit 182, parameter control unit 183, and reading timing control unit 371. Note that the portions corresponding to FIG. 7 in the diagram have the same reference numerals, in the drawing have been denoted with the same reference numerals, and redundant description of the portions with similar processing will be omitted. The reading timing control unit 371 uses a chart shown in FIG. 30, in addition to the chart shown in FIG. 10 as described above, to control the timing for the CPU 113 to read the data from the signal DATA, based on the value of Φn, i.e. based on the virtual control angle Φ. Specifically, the reading timing control unit 184 reads the data from the signal DATA based on the charts shown in FIGS. 10 and 30, such that, in the case that the value of Φn is 1 through 4, the clock counter is set to the timing of 0 and 4, in the case that the value of Φn is 5 through 8, the clock counter is set to the timing of 1 and 5, in the case that the value of Φn is 9 through 12, the clock counter is set to the timing of 2 and 6, in the case that the value of Φn is 13 through 16, the clock counter is set to the timing of 3 and 7, in the case that the value of Φn is 17 through 20, the clock counter is set to the timing of 0 and 4, in the case that the value of Φn is 21 through 24, the clock counter is set to the timing of 1 and 5, in the case that the value of Φn is 25 through 28, the clock counter is set to the timing of 2 and 6, and in the case that the value of Φn is 29, 30, 31, or 0, the clock counter is set to the timing of 3 and 7. That is to say, the reading timing control unit 371 controls the timing for the CPU 113 to read the data from the signal DATA, so as to read the data from the signal DATA twice in one cycle of signal DATA, with timing where the phases differ by Π for one cycle of the signal DATA.

The reading timing control unit 371 generates two lines of timing signals indicating the value of the clock counters which have been set, for one cycle of the signal DATA, and supplies these to the CPU 113.

The CPU 113 reads the data twice for each bit of signal DATA, based on the two lines for timing signals. For example, as shown in FIG. 31, as with the example shown in FIG. 27, in the event that the value of Φn is changed from 0 to 1 going from the n'th bit to the n+1'th bit of signal DATA, the CPU 113 reads the data from the signal DATA at the n'th bit of signal DATA when the clock counter is at 3 and 7, and reads the data from the signal DATA at the n+1'th bit of signal DATA when the clock counter is at 0 and 4. The CPU 113 uses the data wherein a value, for example, such as a sync code or the like, is established beforehand to determine the polarity of the data in the signal DATA, and also selects the correct data from the two line of data which have been read, based on a Cyclic Redundancy Check (CRC) code or the like attached to the signal DATA.

Thus, the original bit row can be accurately extracted from the signal DATA, regardless of the changes to the value of Φn.

Note that with the above description, examples are given to show linear changes of the values sin_para and cos_para as to the control angle Φ, but a value closer to sin Φ and cos Φ may be used.

Also, with the above description, and example is shown wherein the range of values of Φn is 0 through 31, but the range of values of Φn may be further broadened to set the sin_para and cos_para corresponding to Φn, i.e., by arranging to set the virtual control angle Φ more specifically, the phase resolution of the digital PLL 112 can be further improved.

Further, the bit rate of signal DATA employed with the above description, as well as the clock frequency of the clock signal f_clk are an example thereof, and with the embodiments according to the present invention, the bit rate of the signal DATA and the clock frequency of the clock signal f_clk can be set to a value differing from the above-described values.

Also, with the above description, an example is shown to applying the present invention to a non-contact IC chip, but the present invention can be applied to devices having the functionality of demodulating a digital signal subjected to PSK modulation, other than a non-contact IC chip. For example, by providing the digital PLL, to which the present invention has been applied, to an IC chip including a reader/writer function to read/write data of a device having a non-contact IC card function, or a reading function which reads the data of a device having non-contact IC card functionality, the same advantages can be obtained as in the case of providing on the above-mentioned non-contact IC chip. That is to say, data receiving precision from a device having a non-contact IC card function can be improved without increasing the clock frequency.

Further, the embodiments of the present invention are not to be limited to the above-described embodiments, and various modifications can be made without departing from the spirit and scope of the present invention.

What is claimed is:

1. A Phase Locked Loop (PLL) circuit comprising:
   a clock signal generating means configured to generate a first clock signal with a frequency approximately equal to that of a Phase Shift Keying (PSK) modulation signal which is a digital signal subjected to PSK modulation, and a second clock signal of which the phase differs from said first clock signal by Π/2;
   a computing means configured to compute, for each time period of a predetermined length, first phase comparison results showing the results of comparing the phases of a signal wherein said first clock signal is subjected to phase shifting of an amount equivalent to a control angle which is an angle to virtually control the phases of said first clock signal and said second clock signal with said PSK modulation signal during said time period, and second phase comparison results showing the results of comparing the phases of a signal wherein said second clock signal is subjected to phase shifting of an amount equivalent to said control angle with said PSK modulation signal during said time period, based on a first parameter corresponding to the cosine of said control angle, a second parameter corresponding to the sine of said control angle, said first clock signal, said second clock signal, and said PSK modulation signal;
   a control direction setting means configured to set the control direction for virtually controlling said control angle based on said first phase comparison results and said second phase comparison results;
   a parameter control means configured to control said first parameter and said second parameter based on said control angle virtually controlled in said control direction; and
   a reading control means configured to control the timing of reading data from said PSK modulation signal based on said control angle virtually controlled in said control direction.

2. The PLL circuit according to claim 1, wherein said computing means compute said first phase comparison results and said second phase comparison results for each cycle of said PSK modulation signal.

3. The PLL circuit according to claim 1, wherein said computing means compute said first phase comparison results and said second phase comparison results for every ½ cycle of said PSK modulation signal,
   and wherein said control direction setting means finds said control direction for every ½ cycle of said PSK modulation signal, and determines said control direction for every cycle of said PSK modulation signal based on the two control directions obtained.

4. The PLL circuit according to claim 1, wherein said computing means compute a value wherein the sum of a first multiplied value having multiplied said first parameter, said PSK modulation signal, and said first clock signal, and a second multiplied value having multiplied said second parameter, said PSK modulation signal, and said second clock signal, is cumulatively added over said time period as said first phase comparison results, and compute a value wherein the sum of a third multiplied value having inverted the sign of the value wherein said second parameter, said PSK modulation signal, and said first clock signal are multiplied, and a fourth multiplied value having multiplied said first parameter, said PSK modulation signal, and said second clock signal, is cumulatively added over said time period as said second phase comparison results.

5. The PLL circuit according to claim 4, said computing means further comprising:
   a multiplying means configured to compute said first through said fourth multiplied values;
   a first cumulative adding means configured to cumulatively add said first multiplied value every other time, over said time period;
   a second cumulative adding means configured to cumulatively add said first multiplied value every other time, so as to alternate with said first adding means, over said time period;
   a third cumulative adding means configured to cumulatively add said second multiplied value every other time, over said time period;
   a fourth cumulative adding means configured to cumulatively add said second multiplied value every other time, so as to alternate with said third adding means, over said time period;
   a fifth cumulative adding means configured to cumulatively add said third multiplied value every other time, over said time period;
   a sixth cumulative adding means configured to cumulatively add said third multiplied value every other time, so as to alternate with said fifth adding means, over said time period;
   a seventh cumulative adding means configured to cumulatively add said fourth multiplied value every other time, over said time period;

a eighth cumulative adding means configured to cumulatively add said fourth multiplied value every other time, so as to alternate with said seventh adding means, over said time period;

a first adding means configured to compute the sum of said first cumulatively added value computed with said first cumulative adding means and said second cumulatively added value computed with said third cumulative adding means or the sum of said first cumulatively added value computed with said second cumulative adding means and said second cumulatively added value computed with said fourth cumulative adding means; and a second adding means configured to compute the sum of said third cumulatively added value computed with said fifth cumulative adding means and said fourth cumulatively added value computed with said seventh cumulative adding means or the sum of said third cumulatively added value computed with said sixth cumulative adding means and said fourth cumulatively added value computed with said eighth cumulative adding means.

6. The PLL circuit according to claim 1, wherein said reading control means control the timing for reading data from said PSK modulation signal so as to read data twice at a timing wherein the phase differs by Π for a cycle of said PSK modulation signal.

7. A phase control method comprising the steps of:

generating a first clock signal with a frequency approximately equal to that of a Phase Shift Keying (PSK) modulation signal serving as a digital signal subjected to PSK modulation, and a second clock signal of which the phase differs from said first clock signal by Π/2;

computing, for each time period of a predetermined length, first phase comparison results showing the results of comparing the phases of a signal wherein said first clock signal is subjected to phase shifting of an amount equivalent to a control angle which is an angle to virtually control the phases of said first clock signal and said second clock signal with said PSK modulation signal during said time period, and second phase comparison results showing the results of comparing the phases of a signal wherein said second clock signal is subjected to phase shifting of an amount equivalent to said control angle with said PSK modulation signal during said time period based on a first parameter corresponding to the cosine of said control angle, a second parameter corresponding to the sine of said control angle, said first clock signal, said second clock signal, and said PSK modulation signal;

setting the control direction for virtually controlling said control angle based on said first phase comparison results and said second phase comparison results;

controlling said first parameter and said second parameter based on said control angle virtually controlled in said control direction; and controlling the timing of reading data from said PSK modulation signal based on said control angle virtually controlled in said control direction.

8. An Integrated Circuit (IC) chip with the functionality to demodulate a Phase Shift Keying (PSK) modulation signal serving as a digital signal subjected to PSK modulation, having a Phase Locked Loop (PLL) circuit, comprising:

a clock signal generating means configured to generate a first clock signal with a frequency approximately equal that of said PSK modulation signal and a second clock signal of which the phase differs from said first clock signal by Π/2;

a computing means configured to compute, for each time period of a predetermined length, first phase comparison results showing the results of comparing the phases of a signal wherein said first clock signal is subjected to phase shifting of an amount equivalent to a control angle which is an angle to virtually control the phases of said first clock signal and said second clock signal with said PSK modulation signal during said time period and second phase comparison results showing the results of comparing the phases of a signal wherein said second clock signal is subjected to phase shifting of an amount equivalent to said control angle with said PSK modulation signal during said time period, based on a first parameter corresponding to the cosine of said control angle, a second parameter corresponding to the sine of said control angle, said first clock signal, said second clock signal, and said PSK modulation signal;

a control direction setting means configured to set the control direction for virtually controlling said control angle based on said first phase comparison results and said second phase comparison results;

a parameter control means configured to control said first parameter and said second parameter based on said control angle virtually controlled in said control direction; and a reading control means configured to control the timing of reading data from said PSK modulation signal based on said control angle virtually controlled in said control direction.

9. The IC chip according to claim 8, having non-contact IC card functionality, read/write functionality, or read functionality.

10. A Phase Locked Loop (PLL) circuit comprising:

a clock signal generating unit configured to generate a first clock signal with a frequency approximately equal that of a Phase Shift Keying (PSK) modulation signal serving as a digital signal subjected to PSK modulation and a second clock signal of which the phase differs from said first clock signal by Π/2;

a computing unit configured to compute, for each time period of a predetermined length, first phase comparison results showing the results of comparing the phases of a signal wherein said first clock signal is subjected to phase shifting of an amount equivalent to a control angle which is an angle to virtually control the phases of said first clock signal and said second clock signal with said PSK modulation signal during said time period and second phase comparison results showing the results of comparing the phases of a signal wherein said second clock signal is subjected to phase shifting of an amount equivalent to said control angle with said PSK modulation signal during said time period, based on a first parameter corresponding to the cosine of said control angle, a second parameter corresponding to the sine of said control angle, said first clock signal, said second clock signal, and said PSK modulation signal;

a control direction setting unit configured to set the control direction for virtually controlling said control angle based on said first phase comparison results and said second phase comparison results;

a parameter control unit configured to control said first parameter and said second parameter based on said control angle virtually controlled in said control direction; and a reading control unit configured to control the timing of reading data from said PSK modulation signal based on said control angle virtually controlled in said control direction.

11. An Integrated Circuit (IC) chip with the functionality to demodulate a Phase Shift Keying (PSK) modulation signal serving as a digital signal subjected to PSK modulation, having a Phase Locked Loop (PLL) circuit, comprising:

a clock signal generating unit configured to generate a first clock signal with a frequency as with that of said PSK modulation signal and a second clock signal of which the phase differs from said first clock signal by Π/2;

a computing unit configured to compute, for each time period of a predetermined length, first phase comparison results showing the results of comparing the phases of a signal wherein said first clock signal is subjected to phase shifting of an amount equivalent to a control angle which is an angle to virtually control the phases of said first clock signal and said second clock signal with said PSK modulation signal during said time period and second phase comparison results showing the results of comparing the phases of a signal wherein said second clock signal is subjected to phase shifting of an amount equivalent to said control angle with said PSK modulation signal during said time period, based on a first parameter corresponding to the cosine of said control angle, a second parameter corresponding to the sine of said control angle, said first clock signal, said second clock signal, and said PSK modulation signal;

a control direction setting unit configured to set the control direction for virtually controlling said control angle based on said first phase comparison results and said second phase comparison results;

a parameter control unit configured to control said first parameter and said second parameter based on said control angle virtually controlled in said control direction; and a reading control unit configured to control the timing of reading data from said PSK modulation signal based on said control angle virtually controlled in said control direction.

* * * * *